(12) United States Patent
Yoon et al.

(10) Patent No.: US 12,087,879 B2
(45) Date of Patent: Sep. 10, 2024

(54) DISPLAY DEVICE AND METHOD OF MANUFACTURING LIGHT EMITTING DEVICE

(71) Applicant: SAMSUNG ELECTRONICS CO., LTD., Suwon-si (KR)

(72) Inventors: Euijoon Yoon, Seoul (KR); Jehong Oh, Seoul (KR); Jungel Ryu, Seoul (KR); Seungmin Lee, Seoul (KR); Jongmyeong Kim, Uiwang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/303,423

(22) Filed: Apr. 19, 2023

(65) Prior Publication Data

US 2023/0299234 A1  Sep. 21, 2023

Related U.S. Application Data

(63) Continuation of application No. 17/238,196, filed on Apr. 22, 2021, now Pat. No. 11,705,537.

(30) Foreign Application Priority Data

Apr. 23, 2020 (KR) .................. 10-2020-0049136
Feb. 22, 2021 (KR) .................. 10-2021-0023123

(51) Int. Cl.
*H01L 33/00* (2010.01)
*H01L 25/075* (2006.01)
(Continued)

(52) U.S. Cl.
CPC .......... *H01L 33/24* (2013.01); *H01L 25/0753* (2013.01); *H01L 33/0095* (2013.01); *H01L 33/16* (2013.01); *H01L 33/32* (2013.01)

(58) Field of Classification Search
CPC ..................................................... H01L 33/007
(Continued)

(56) References Cited

U.S. PATENT DOCUMENTS 7,888,690 B2  2/2011  Iwafuchi et al.
8,154,022 B2  4/2012  Arena et al.
(Continued)

FOREIGN PATENT DOCUMENTS

CN  107302010 A  10/2017
JP  2006-339551 A  12/2006
(Continued)

OTHER PUBLICATIONS

Communication dated Jun. 8, 2022 issued by the Korean Intellectual Property Office in counterpart Korean Application No. 10-2021-0023123.

(Continued)

*Primary Examiner* — Hsin Yi Hsieh
(74) *Attorney, Agent, or Firm* — Sughrue Mion, PLLC

(57) ABSTRACT

Disclosed are a display device and a manufacturing method thereof. The display device includes a plurality of pixels, a light emitting device provided in each of the plurality of pixels, the light emitting device having a first surface and a second surface, which are opposite to each other, a first electrode electrically connected to the first surface of the light emitting device, a second electrode electrically connected to the second surface of the light emitting device, and a metal oxide pattern interposed between the second surface of the light emitting device and the second electrode. The metal oxide pattern is provided to cover a portion of the second surface and to expose a remaining portion of the second surface. The second electrode is electrically connected to the exposed remaining portion of the second (Continued)

surface, and the metal oxide pattern includes single-crystalline or polycrystalline alumina.

7 Claims, 31 Drawing Sheets

(51) Int. Cl.
   *H01L 33/16* (2010.01)
   *H01L 33/24* (2010.01)
   *H01L 33/32* (2010.01)
(58) Field of Classification Search
   USPC .......................................................... 438/22
   See application file for complete search history.

(56) References Cited

U.S. PATENT DOCUMENTS

| | | |
|---|---|---|
| 11,145,798 B2 | 10/2021 | Yoon et al. |
| 2004/0266043 A1 | 12/2004 | Oohata et al. |
| 2007/0085087 A1 | 4/2007 | Okuyama et al. |
| 2010/0194719 A1 | 8/2010 | Saitoh et al. |
| 2016/0149083 A1* | 5/2016 | Faurie ............... H01L 21/02502 438/492 |
| 2019/0088820 A1 | 3/2019 | Danesh et al. |
| 2020/0035890 A1 | 1/2020 | Yoon et al. |
| 2022/0140189 A1 | 5/2022 | Lee et al. |

FOREIGN PATENT DOCUMENTS

| | | |
|---|---|---|
| KR | 10-2008-0107256 A | 12/2008 |
| KR | 10-2020-0012541 A | 2/2020 |
| WO | 2009/144918 A1 | 12/2009 |

OTHER PUBLICATIONS

Communication dated May 30, 2022 issued by the International Searching Authority in counterpart Application No. PCT/KR2021/005821 (PCT/ISA/220 and PCT/ISA/210).
Notice of Allowance issued in parent U.S. Appl. No. 17/238,196 mailed Mar. 31, 2023.

* cited by examiner

DISPLAY DEVICE AND METHOD OF MANUFACTURING LIGHT EMITTING DEVICE

CROSS-REFERENCE TO RELATED APPLICATIONS

This is a continuation of U.S. application Ser. No. 17/238,196, filed on Apr. 22, 2021, which claims priority under 35 U.S.C. § 119 to Korean Patent Application Nos. 10-2020-0049136 and 10-2021-0023123, filed on Apr. 23, 2020 and Feb. 22, 2021, respectively, in the Korean Intellectual Property Office, the entire contents of which are hereby incorporated by reference.

BACKGROUND

The present disclosure relates to a display device with improved light-emitting efficiency and a method of manufacturing a light emitting device.

A display device includes a light emitting device. The light emitting device is electrically connected to an electrode and emits light in response to a voltage applied to the electrode. The light emitting device may be directly formed on the electrode. Alternatively, the light emitting device may be formed and then may be placed on the electrode.

The light emitting device may be a light-emitting diode (LED). The LED is a semiconductor device converting an energy, which is generated from recombination of holes and electrons when forward voltage is applied to a pn junction diode, to light energy. The LED may be classified into an inorganic LED or an organic LED. The LED may be used not only in small-sized electronic products such as cellphones, but also in large-sized electronic products such as television sets.

SUMMARY

An embodiment of the inventive concept provides a patterned sapphire substrate, which allows for selective area growth and is free from an impurity contamination issue, and a method of manufacturing the same.

An embodiment of the inventive concept provides a method of manufacturing a light emitting device, using the patterned sapphire substrate.

An embodiment of the inventive concept provides a display device including the light emitting device.

According to an embodiment of the inventive concept, a display device may include a plurality of pixels, a light emitting device provided in each of the plurality of pixels, the light emitting device having a first surface and a second surface, which are opposite to each other, a first electrode electrically connected to the first surface of the light emitting device, a second electrode electrically connected to the second surface of the light emitting device, and a metal oxide pattern interposed between the second surface of the light emitting device and the second electrode. The metal oxide pattern may be provided to cover a portion of the second surface and to expose a remaining portion of the second surface. The second electrode may be electrically connected to the exposed remaining portion of the second surface, and the metal oxide pattern may include single-crystalline or polycrystalline alumina.

According to an embodiment of the inventive concept, a method of manufacturing a light emitting device may include preparing a patterned substrate, which includes a substrate, a polycrystalline layer on the substrate, and a seed pattern protruding above the polycrystalline layer, and performing a metal organic chemical vapor deposition process on the patterned substrate to form a light emitting device and an epitaxial layer on the seed pattern and the polycrystalline layer, respectively. A growth rate of the light emitting device on the seed pattern may be higher than a growth rate of the epitaxial layer on the polycrystalline layer, during the metal organic chemical vapor deposition process.

According to an embodiment of the inventive concept, a patterned sapphire substrate may include a sapphire substrate, a seed pattern vertically protruding from a top surface of the sapphire substrate, and a polycrystalline layer covering the top surface of the sapphire substrate but exposing the seed pattern. The seed pattern may include single-crystalline alumina, and the polycrystalline layer may include polycrystalline alumina.

DETAILED DESCRIPTION

Figure 1:
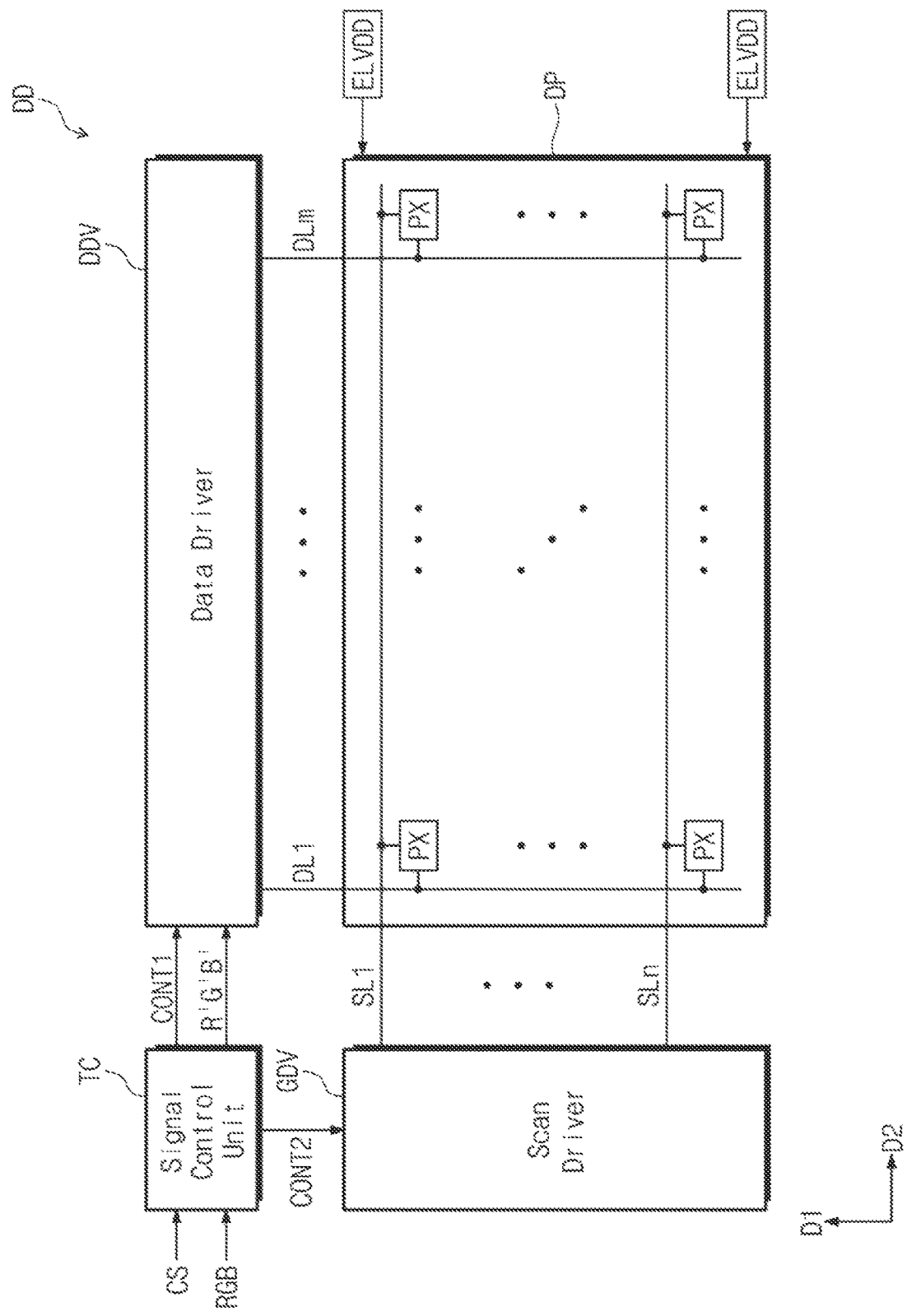
FIG. 1 is a block diagram illustrating a display device according to an embodiment of the inventive concept.

In order to sufficiently understand the configuration and effect of the inventive concept, some embodiments of the inventive concept will be described with reference to the accompanying drawings. It should be noted, however, that the inventive concept are not limited to the following exemplary embodiments, and may be implemented in various forms. Rather, the exemplary embodiments are provided only to disclose the inventive concept and let those skilled in the art fully know the scope of the inventive concept.

In this description, it will be understood that, when an element is referred to as being on another element, the element can be directly on the other element or intervening elements may be present therebetween. In the drawings, thicknesses of some components are exaggerated for effectively explaining the technical contents. Like reference numerals refer to like elements throughout the specification.

Some example embodiments detailed in this description will be discussed with reference to sectional and/or plan views as ideal exemplary views of the inventive concept. In the drawings, thicknesses of layers and regions are exaggerated for effectively explaining the technical contents. Accordingly, regions exemplarily illustrated in the drawings have general properties, and shapes of regions exemplarily illustrated in the drawings are used to exemplarily disclose specific shapes but not limited to the scope of the inventive concept. It will be understood that, although the terms "first", "second", "third", etc. may be used herein to describe various elements, these elements should not be limited by these terms. These terms are only used to distinguish one element from another element. The embodiments explained and illustrated herein include complementary embodiments thereof.

The terminology used herein is for the purpose of describing particular embodiments only and is not intended to limit the inventive concept. As used herein, the singular forms are intended to include the plural forms as well. The terms 'comprises/includes' and/or 'comprising/including' used in the specification do not exclude the presence or addition of one or more other components.

FIG. 1 is a block diagram illustrating a display device according to an embodiment of the inventive concept.

Referring to FIG. 1, a display device DD may include a display panel DP, a signal control unit TC or a timing controller, a data driver DDV, and a scan driver GDV. Each of the signal control unit TC, the data driver DDV, and the scan driver GDV may include a circuit.

The display panel DP may include a light emitting device. For example, the display panel DP may include a micro-LED. The display panel DP may include a plurality of data lines DLl to DLm, a plurality of scan lines SL1 to SLn, and a plurality of pixels PX.

The data lines DLl to DLm may be extended in a first direction D1. The data lines DLl to DLm may be arranged in a second direction D2 crossing the first direction D1. The scan lines SL1 to SLn may be extended in the second direction D2. The scan lines SL1 to SLn may be arranged in the first direction D1.

Each of the pixels PX may include a light emitting device and a pixel circuit electrically connected to the light emitting device. The pixel circuit may include a plurality of transistors. A first power voltage ELVDD and a second power voltage ELVSS may be provided in each of the pixels PX.

The pixels PX may be arranged on a surface of the display panel DP, in a regular manner or with a specific arrangement rule. Each of the pixels PX may be configured to display one of primary colors or one of mixed colors. The primary colors may include red, green, and blue colors. The mixed colors may include yellow, cyan, magenta, and white colors. However, colors, which can be displayed by the pixels PX, are not limited to the above colors.

The signal control unit TC may receive an image data RGB provided from the outside. The signal control unit TC may be configured to convert the image data RGB to image data R'G'B', which are suitable for operations of the display panel DP, and to output the converted image data R'G'B' to the data driver DDV.

The signal control unit TC may receive a control signal CS provided from the outside. The control signal CS may include a vertical synchronization signal, a horizontal synchronization signal, a main clock signal, and a data enable signal. The signal control unit TC may provide a first control signal CONT1 to the data driver DDV and may provide a second control signal CONT2 to the scan driver GDV. The first control signal CONT1 may be used to control the data driver DDV, and the second control signal CONT2 may be used to control the scan driver GDV.

The data driver DDV may drive the data lines DLl to DLm, in response to the first control signal CONT1 provided from the signal control unit TC. The data driver DDV may be provided in the form of a separate integrated circuit, and then it may be electrically connected to a portion of the display panel DP or may be directly mounted on the display panel DP. In an embodiment, the data driver DDV may be provided in the form of a single chip or a plurality of chips.

The scan driver GDV may drive the scan lines SL1 to SLn, in response to the second control signal CONT2 provided from the signal control unit TC. As an example, the scan driver GDV may be integrated on a region of the display panel DP. In this case, the scan driver GDV may include a plurality of thin-film transistors that are formed by the same process as that for a driving circuit of the pixel PX (e.g., by a low temperature polycrystalline silicon (LTPS) process or a low temperature polycrystalline oxide (LTPO) process). Alternatively, the scan driver GDV may be provided in the form of a separate integrated circuit chip and then may be electrically connected to a portion of the display panel DP.

In the case where one of the scan lines SL1 to SLn is applied with a gate-on voltage, switching transistors in a row of pixels connected thereto may be turned on. Here, the data driver DDV may provide data driving signals to the data lines DLl to DLm. The data driving signals provided to the data lines DLl to DLm may be applied to corresponding pixels through the turned-on switching transistors. The data driving signals may be analog voltages corresponding to gradation levels of the image data.

Figure 2:
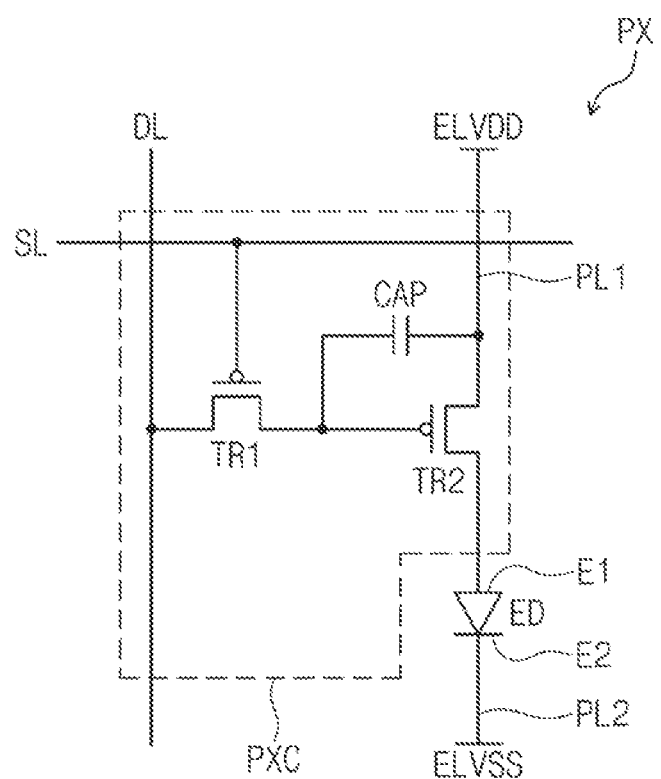
FIG. 2 is an equivalent circuit diagram illustrating a pixel according to an embodiment of the inventive concept.

FIG. 2 is an equivalent circuit diagram illustrating a pixel according to an embodiment of the inventive concept.

Referring to FIG. 2, the pixel PX may be connected to a plurality of signal lines. In the present embodiment, the signal lines may include a scan line SL, a data line DL, a first power line PL1, and a second power line PL2.

The pixel PX may include a light emitting device ED and a pixel circuit PXC. The pixel circuit PXC may include a first thin-film transistor TR1, a capacitor CAP, and a second thin-film transistor TR2.

The first thin-film transistor TR1 may be a switching transistor, which is used to control the on/off operation of the pixel PX. The first thin-film transistor TR1 may transmit or block a data signal transmitted through the data line DL, in response to a gate signal transmitted through the scan line GL.

The capacitor CAP may be provided between and connected to the first thin-film transistor TR1 and the first power line PL1. An amount of electric charges stored in the capacitor CAP may vary depending on a difference in voltage between the data signal transmitted from the first thin-film transistor TR1 and the first power voltage ELVDD applied to the first power line PL1.

The second thin-film transistor TR2 may be connected to the first thin-film transistor TR1, the capacitor CAP, and the light emitting device ED. The second thin-film transistor TR2 may control a driving current flowing through the light emitting device ED, based on the amount of charges stored in the capacitor CAP. For example, a turn-on time of the second thin-film transistor TR2 may be determined depending on the amount of charges stored in the capacitor CAP.

The first and second thin-film transistors TR1 and TR2 may be n-type or p-type thin-film transistors. Alternatively, at least one of the first and second thin-film transistors TR1 and TR2 may be an n-type thin-film transistor, and the other may be a p-type thin-film transistor.

The light emitting device ED may be provided between and connected to the second thin-film transistor TR2 and the second power line PL2. The light emitting device ED may emit light, when there is a difference in voltage between a signal transmitted through the second thin-film transistor TR2 and the second power voltage ELVSS received through the second power line PL2.

The light emitting device ED may be an ultra-small LED device. The ultra-small LED device may be an LED device whose size is in a range from several nano-meters to several hundreds of micro-meters. However, the size of the ultra-small LED device is merely illustrative example, and is not limited to the afore-mentioned size range.

An example, in which just one light emitting device ED is provided between the second thin-film transistor TR2 and the second power line PL2, is illustrated in FIG. 2, but, in an embodiment, a plurality of light emitting devices ED may be provided. The plurality of the light emitting devices ED may be connected in parallel to each other.

Figure 3:
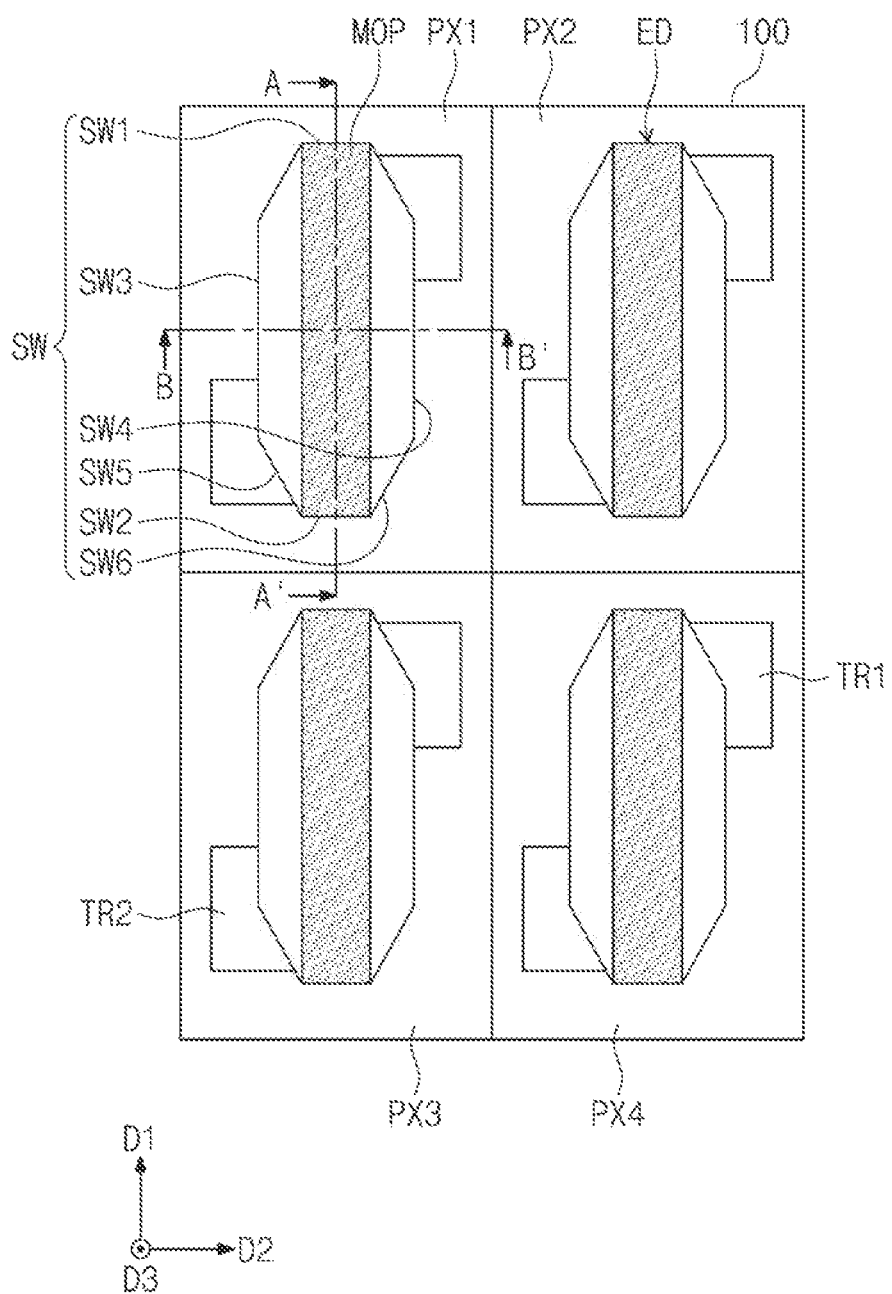
FIG. 3 is a plan view illustrating a display panel of a display device according to an embodiment of the inventive concept.
Figure 4A:
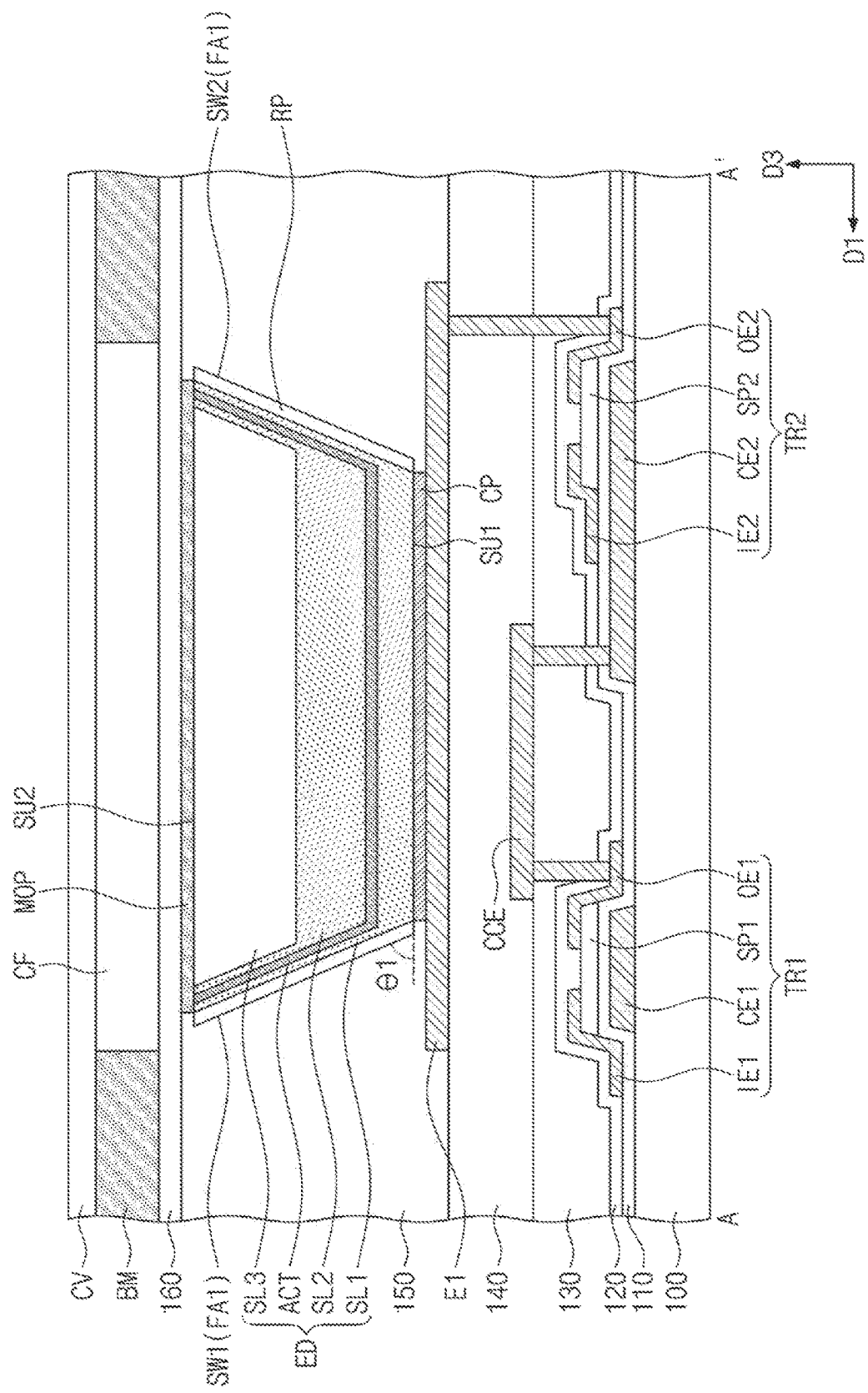
FIG. 4A is a sectional view taken along a line A-A' of FIG. 3.
Figure 4B:
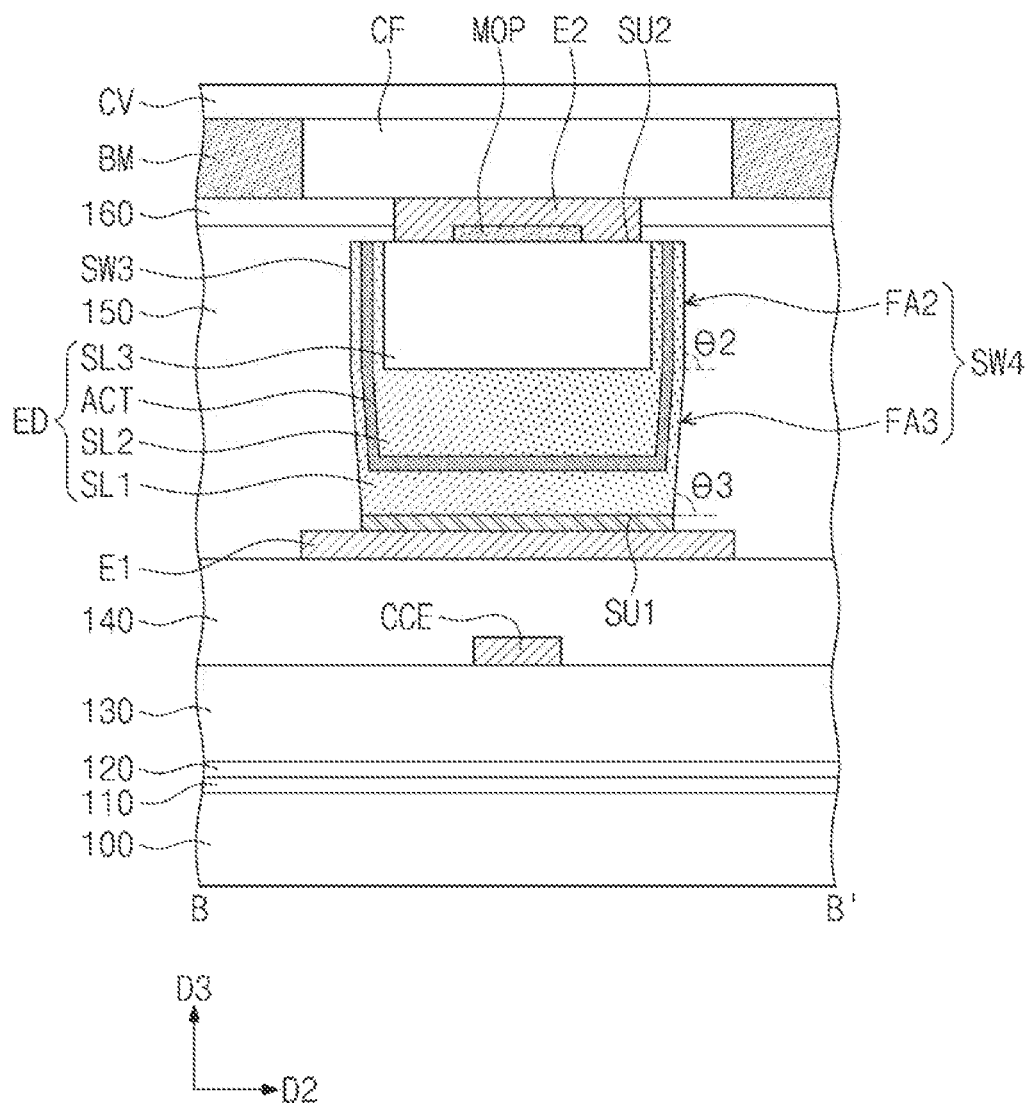
FIG. 4B is a sectional view taken along a line B-B' of FIG. 3.
Figure 5A:
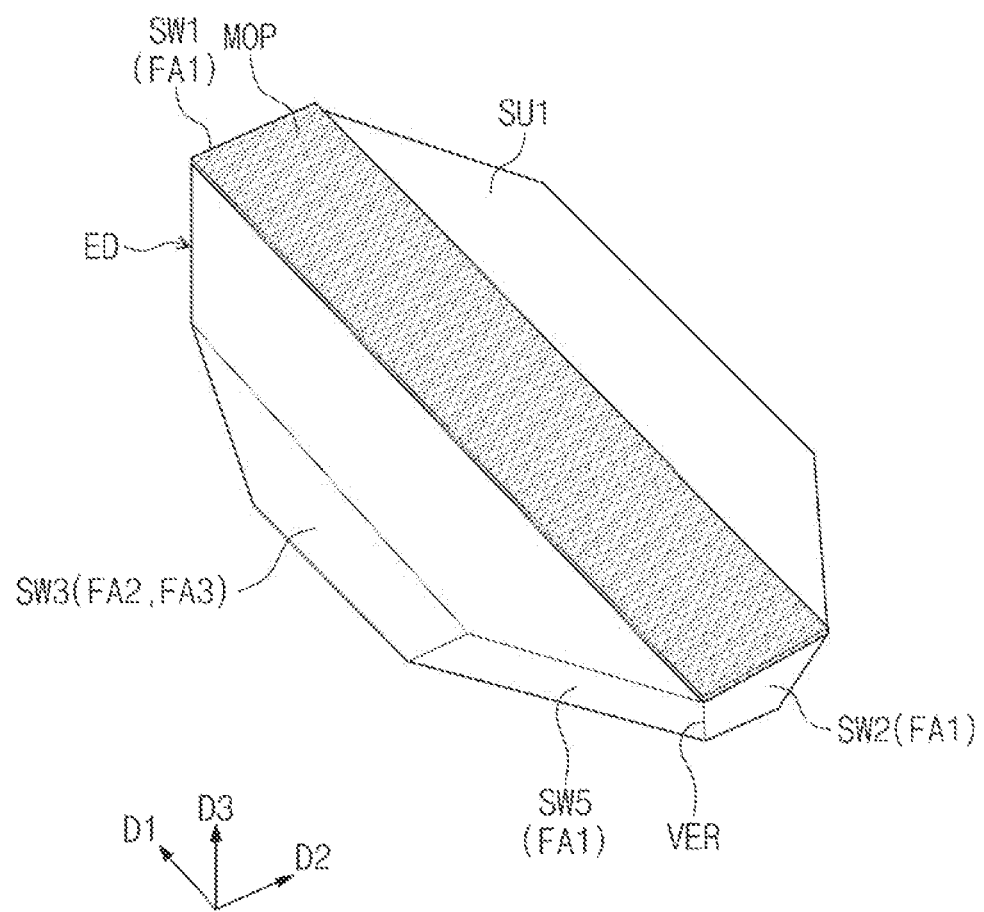
FIG. 5A is a perspective view illustrating a light emitting device of FIG. 3.
Figure 5B:
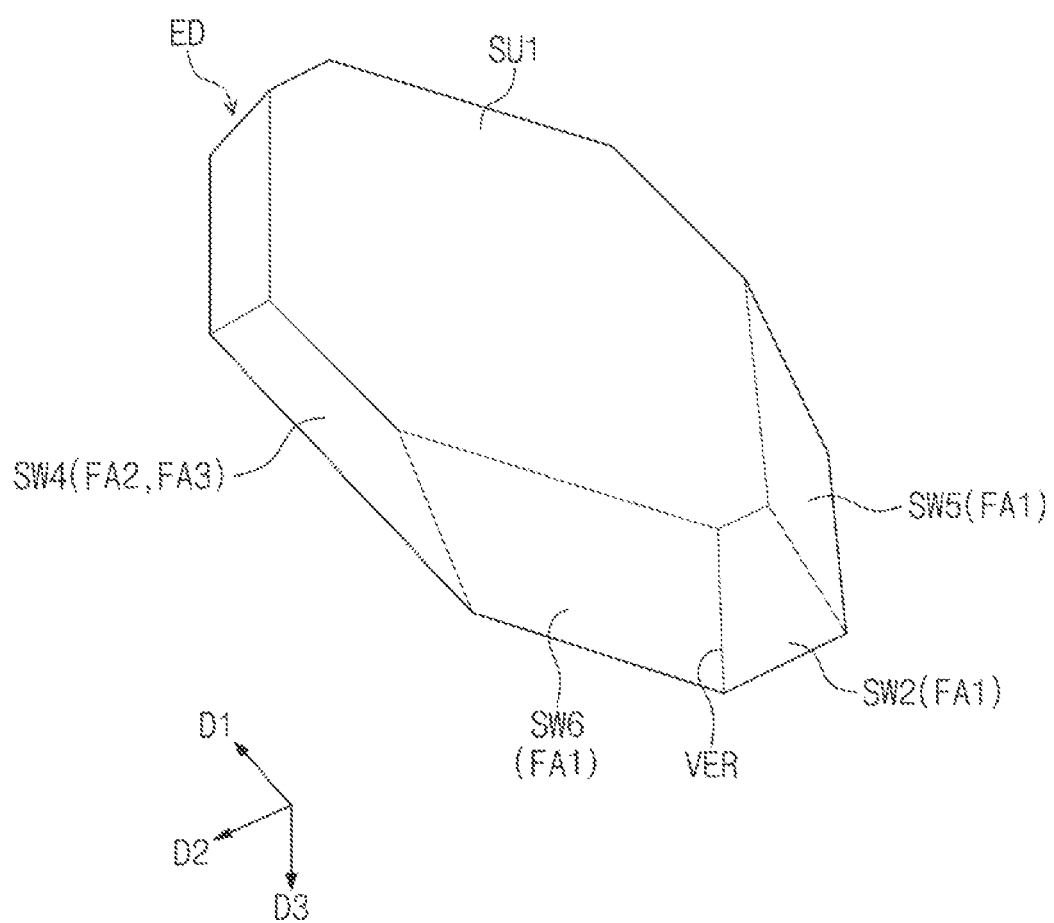
FIG. 5B is a perspective view illustrating an inverted structure of the light emitting device of FIG. 5A.

FIG. 3 is a plan view illustrating a display panel of a display device according to an embodiment of the inventive concept. FIG. 4A is a sectional view taken along a line A-A' of FIG. 3. FIG. 4B is a sectional view taken along a line B-B' of FIG. 3. FIG. 5A is a perspective view illustrating a light emitting device of FIG. 3. FIG. 5B is a perspective view illustrating an inverted structure of the light emitting device of FIG. 5A.

Referring to FIGS. 3, 4A, 4B, 5A, and 5B, first to fourth pixels PX1 to PX4 may be provided on a base layer 100. The base layer 100 may include a silicon substrate, a plastic substrate, a glass substrate, an insulating film, or a stack including a plurality of insulating layers.

The first to fourth pixels PX1 to PX4 may be two-dimensionally arranged. The first and second pixels PX1 and PX2 may be adjacent to each other in the second direction D2, and the third and fourth pixels PX3 and PX4 may be adjacent to each other in the second direction D2. The first and third pixels PX1 and PX3 may be adjacent to each other in the first direction D1, and the second and fourth pixels PX2 and PX4 may be adjacent to each other in the first direction D1. Each of the first to fourth pixels PX1 to PX4 may include the first thin-film transistor TR1, the second thin-film transistor TR2, and the light emitting device ED.

Hereinafter, one (e.g., the first pixel PX1) of the first to fourth pixels PX1 to PX4 will be exemplarily described.

The first and second thin-film transistors TR1 and TR2 may be disposed on the base layer 100. The first thin-film transistor TR1 may include a first control electrode CE1, a first input electrode IE1, a first output electrode OE1, and a first semiconductor pattern SP1. The second thin-film transistor TR2 may include a second control electrode CE2, a second input electrode IE2, a second output electrode OE2, and a second semiconductor pattern SP2.

The first control electrode CE1 and the second control electrode CE2 may be provided on the base layer 100. The first control electrode CE1 and the second control electrode CE2 may be formed of or include a conductive material. A first insulating layer 110 may be provided on the base layer 100 to cover the first control electrode CE1 and the second control electrode CE2. In other words, the first control electrode CE1 and the second control electrode CE2 may be interposed between the first insulating layer 110 and the base layer 100.

The first semiconductor pattern SP1 and the second semiconductor pattern SP2 may be provided on the first insulating layer 110. Each of the first and second semiconductor patterns SP1 and SP2 may be formed of or include a semiconductor material. For example, the semiconductor material may include at least one of amorphous silicon, poly silicon, single-crystalline silicon, oxide semiconductor materials, or compound semiconductor materials. Each of the first and second semiconductor patterns SP1 and SP2 may include a channel region, which is used as a conduction path of electrons or holes, and a first impurity region and a second impurity region, which are spaced apart from each other with the channel region interposed therebetween.

The first input electrode IE1 and the first output electrode OE1 may be provided on the first semiconductor pattern SP1. The first input electrode IE1 and the first output electrode OE1 may be respectively connected to the first and second impurity regions of the first semiconductor pattern SP1. The second input electrode IE2 and the second output electrode OE2 may be provided on the second semiconductor pattern SP2. The second input electrode IE2 and the second output electrode OE2 may be respectively connected to the first and second impurity regions of the second semiconductor pattern SP2.

A second insulating layer 120 may be provided on the first insulating layer 110 to cover the first and second semiconductor patterns SP1 and SP2, the first and second input electrodes IE1 and IE2, and the first and second output electrodes OE1 and OE2. In other words, the first and second semiconductor patterns SP1 and SP2, the first and second input electrodes IE1 and IE2, and the first and second output electrodes OE1 and OE2 may be interposed between the first insulating layer 110 and the second insulating layer 120.

A third insulating layer 130 may be provided on the second insulating layer 120. The third insulating layer 130 may have a substantially flat top surface. A connection electrode CCE may be disposed on the third insulating layer 130 to electrically connect the first output electrode OE1 to the second control electrode CE2. The connection electrode CCE may include a first contact, which is provided to penetrate the second and third insulating layers 120 and 130 and is coupled to the first output electrode OE1. In addition, the connection electrode CCE may include a second contact, which is provided to penetrate the first to third insulating layers 110, 120, and 130 and is coupled to the second control electrode CE2.

A fourth insulating layer 140 may be provided on the third insulating layer 130 to cover the connection electrode CCE. A first electrode E1 may be provided on the fourth insulating layer 140. The first electrode E1 may include a third contact, which is provided to penetrate the second to fourth insulating layers 120, 130, and 140 and is coupled to the second output electrode OE2.

A fifth insulating layer 150 may be provided on the fourth insulating layer 140 to cover the first electrode E1. The light emitting device ED may be provided on the first electrode E1. The light emitting device ED may be provided in the fifth insulating layer 150. The light emitting device ED may have a first surface SU1 and a second surface SU2, which are opposite to each other in a third direction D3. As an example, the first surface SU1 may be a bottom surface of the light emitting device ED, and the second surface SU2 may be a top surface of the light emitting device ED. An area of the first surface SU1 may be smaller than an area of the second surface SU2. In an embodiment, a p-type semiconductor layer of the light emitting device ED may be adjacent to the first surface SU1, and an n-type semiconductor layer of the light emitting device ED may be adjacent to the second surface SU2.

A connection pattern CP may be interposed between the light emitting device ED and the first electrode E1. The connection pattern CP may be provided on the first surface SU1 of the light emitting device ED. The connection pattern CP may be formed of or include at least one of metallic materials (e.g., Ni, Au, alloys of Ni and Au, or a multilayer of Ni/Au layers) having a low melting temperature.

The light emitting device ED and the first electrode E1 may be electrically connected to each other through the connection pattern CP. For example, the light emitting device ED may include a first semiconductor layer SL1, as will be described below, and the first electrode E1 may be connected to the first semiconductor layer SL1 of the light emitting device ED. The first electrode E1 may be a p-type electrode. The first electrode E1 may be electrically connected to the first power line PL1 previously described with reference to FIG. 2. In other words, the first power voltage ELVDD of FIG. 2 may be applied to the first electrode E1.

The light emitting device ED may include a first semiconductor layer SL1, an active layer ACT, a second semiconductor layer SL2, and a third semiconductor layer SL3, which are sequentially stacked. The active layer ACT and the first to third semiconductor layers SL1, SL2, and SL3 may be formed of or include at least one of III-V compound semiconductor materials. The active layer ACT and the first to third semiconductor layers SL1, SL2, and SL3 may be formed of or include at least one of GaN-based semiconductor materials. In an embodiment, the active layer ACT and the first to third semiconductor layers SL1, SL2, and SL3 may be formed of or include at least one of GaN, AlN, AlGaN, InGaN, InN, InAlGaN, AlInN, or combinations thereof.

The first to third semiconductor layers SL1, SL2, and SL3 may be formed of or include the same GaN semiconductor material. As an example, the first to third semiconductor layers SL1, SL2, and SL3 may be formed of or include GaN. The first semiconductor layer SL1 may be a p-type semiconductor layer. The first semiconductor layer SL1 may contain an impurity, such as magnesium (Mg), zinc (Zn), calcium (Ca), strontium (Sr), or barium (Ba). The second semiconductor layer SL2 may be an n-type semiconductor layer. The second semiconductor layer SL2 may contain an impurity, such as silicon (Si), germanium (Ge), tin (Sn), selenium (Se), or tellurium (Te). The third semiconductor layer SL3 may be an undoped semiconductor layer.

The active layer ACT may be interposed between the first semiconductor layer SL1 and the second semiconductor layer SL2. The active layer ACT may be a region, in which holes injected through the first semiconductor layer SL1 are recombined with electrons injected through the second semiconductor layer SL2. As a result of the electron-hole recombination, light may be emitted from the active layer ACT. The active layer ACT may have at least one of a single quantum well structure, a multiple quantum well structure, a quantum wire structure, or a quantum dot structure. As an example, the active layer ACT may have a multiple quantum well structure containing InGaN and GaN.

The first semiconductor layer SL1, the active layer ACT, the second semiconductor layer SL2, and the third semiconductor layer SL3 may be sequentially stacked on the first surface SU1 of the light emitting device ED. Furthermore, the first semiconductor layer SL1, the active layer ACT, the second semiconductor layer SL2, and the third semiconductor layer SL3 may be sequentially stacked on a sidewall SW of the light emitting device ED. In other words, each of the first semiconductor layer SL1, the active layer ACT, and the second semiconductor layer SL2 may have a 'U'-shaped section. Each of the first semiconductor layer SL1, the active layer ACT, and the second semiconductor layer SL2 may have a shape enclosing bottom and side surfaces of the third semiconductor layer SL3.

The active layer ACT adjacent to the sidewall SW of the light emitting device ED may be interposed between the first semiconductor layer SL1 and the second semiconductor layer SL2. In other words, the active layer ACT adjacent to the sidewall SW of the light emitting device ED may be veiled by the first semiconductor layer SL1 and may not be exposed to the outside. The first semiconductor layer SL1 adjacent to the sidewall SW of the light emitting device ED may passivate the active layer ACT. Since the active layer ACT is protected by the first semiconductor layer SL1, electric characteristics of the active layer ACT may be improved, and thus, light-emitting efficiency of the light emitting device ED may be improved.

A thickness of the first semiconductor layer SL1 in the third direction D3 may be larger than a thickness of the first semiconductor layer SL1 on the sidewall SW of the light emitting device ED. A thickness of the second semiconductor layer SL2 in the third direction D3 may be larger than a thickness of the second semiconductor layer SL2 on the sidewall SW of the light emitting device ED. This is because a GaN growth rate in the third direction D3 is highest in a growth process of the light emitting device ED, which will be described below.

When viewed in a plan view, the light emitting device ED may have an octagonal shape. In an embodiment, although not shown, the light emitting device ED may have one of polygonal shapes (e.g., a hexagonal shape). The light emitting device ED may have a section that is shaped like a truncated inverted pyramid. In other words, the light emitting device ED may be provided to have a shape of a truncated octagonal pillar (e.g., see FIGS. 5A and 5B).

The light emitting device ED may include the sidewall SW, which is slantly extended from the first surface SU1 and the second surface SU2. For example, the sidewall SW may include first to sixth sidewalls SW1 to SW6.

The light emitting device ED may further include a vertex VER, which is formed by two of the sidewalls SW meeting each other. For example, the vertex VER may be defined at a point where the second and fifth sidewalls SW2 and SW5 meet. The vertex VER may be extended from the first surface SU1 of the light emitting device ED to the second surface SU2 (e.g., see FIGS. 5A and 5B).

Each of the first surface SU1, the second surface SU2, and the sidewall SW of the light emitting device ED may have a wurtzite crystal structure. Each of the first and second surfaces SU1 and SU2 of the light emitting device ED may be a c-plane that is a polar plane. Each of the first and second surfaces SU1 and SU2 may be a (0001) facet. The polar plane or the c-plane may be a surface that is made up of only one kind of atoms. In an embodiment, the polar plane or the c-plane may be a surface that is made up of only gallium (Ga) atoms or only nitrogen (N) atoms.

The sidewall SW of the light emitting device ED may be inclined at an angle to the first and second surfaces SU1 and SU2. In an embodiment, the first, second, fifth, and sixth sidewalls SW1, SW2, SW5, and SW6 of the light emitting device ED may have the same angle. The third and fourth sidewalls SW3 and SW4 may have the same angle. The first, second, fifth, and sixth sidewalls SW1, SW2, SW5, and SW6 may be inclined at an angle different from the third and fourth sidewalls SW3 and SW4.

Each of the first, second, fifth, and sixth sidewalls SW1, SW2, SW5, and SW6 may include a first facet FA1. The first facet FA1 may be inclined at a first angle $\theta 1$ to the first surface SU1. The first angle $\theta 1$ may range from 10° to 80°.

The first facet FA1 may be a semi-polar plane. In detail, the first facet FA1 may be a {n -n 0 k} facet. Here, each of indices n and k is an integer of 1 or greater. As an example, the first facet FA1 may be a {1 -1 0 1} plane.

If the sidewall SW of the light emitting device ED is a surface that is perpendicular to the first surface SU1 (e.g., if the first angle $\theta 1$ is about 90°), light generated in the active layer ACT may be leaked through the sidewall SW, and in this case, the light extraction efficiency may be reduced. However, according to an embodiment of the inventive concept, since the light emitting device ED has the sidewall SW that is inclined at an angle, it may be possible to effectively prevent the light from being leaked through the sidewall SW. Accordingly, the light emitting device ED may have high light extraction efficiency.

Each of the third and fourth sidewalls SW3 and SW4 may include a second facet FA2 and a third facet FA3. The second facet FA2 may be positioned on the third facet FA3. The second facet FA2 may be positioned adjacent to the second surface SU2, and the third facet FA3 may be positioned adjacent to the first surface SU1. The second and third facets FA2 and FA3, which are vertically arranged, may connect the first surface SU1 to the second surface SU2 (e.g., see FIG. 4B).

The second facet FA2 may be an a-plane that is a nonpolar plane. The second facet FA2 may be substantially perpendicular to the first surface SU1. The second facet FA2 may be inclined at a second angle $\theta 2$ to the first surface SU1. The second angle $\theta 2$ may be greater than the first angle $\theta 1$. The second angle $\theta 2$ may be about 90°. In an embodiment, the second facet FA2 may be a {1 1 -2 0} plane.

The third facet FA3 may be a semi-polar plane. For example, the third facet FA3 may be a {n n -2n k} plane. Here, each of indices n and k is an integer of 1 or greater. As an example, the third facet FA3 is a {1 1 -2 2} plane. The third facet FA3 may be inclined at a third angle $\theta 3$ to the first surface SU1. The third angle $\theta 3$ may be greater than the first angle $\theta 1$ and may be smaller than the second angle $\theta 2$.

Since each of the third and fourth sidewalls SW3 and SW4 further includes not only the second facet FA2 but also the third facet FA3, it may be possible to prevent light, which is generated in the active layer ACT, from being leaked through the sidewall SW and thereby to improve the light extraction efficiency.

According to an embodiment of the inventive concept, due to the inclined shape of the sidewall SW of the light emitting device ED, a width of the light emitting device ED may increase with increasing distance from the base layer 100.

A reflection pattern RP may be interposed between the light emitting device ED and the fifth insulating layer 150. The reflection pattern RP may directly cover the sidewall SW of the light emitting device ED. The reflection pattern RP may prevent the light, which is generated in the active layer ACT, from being leaked through the sidewall SW of the light emitting device ED. In other words, the reflection pattern RP may be configured to reflect the light, which is generated in the active layer ACT, and to guide the light to the second surface SU2 of the light emitting device ED, and thus, the light may be emitted through the second surface SU2 of the light emitting device ED.

A metal oxide pattern MOP may be provided on the second surface SU2 of the light emitting device ED. The metal oxide pattern MOP may directly cover the second surface SU2 of the light emitting device ED. The metal oxide pattern MOP may be provided to cover a portion of the second surface SU2 and to expose the remaining portion. For example, a ratio of an area of the metal oxide pattern MOP to the total area of the second surface SU2 may range from 0.2 to 0.7. The metal oxide pattern MOP may be formed of or include at least one of insulating materials such as metal oxides, and in an embodiment, the metal oxides may include aluminum oxide (i.e., alumina). The metal oxide pattern MOP may be used as a passivation layer covering a portion of the second surface SU2.

The metal oxide pattern MOP may be extended on the second surface SU2 in the first direction D1, which is a direction of a longitudinal axis of the light emitting device ED. For example, the metal oxide pattern MOP may be provided on the second surface SU2 and may be extended from the second sidewall SW2 to first sidewall SW1 (e.g., see FIG. 5A).

As an example, the metal oxide pattern MOP may have a single-crystalline α-phase. As another example, the metal oxide pattern MOP may have a polycrystalline γ-phase. As other example, the metal oxide pattern MOP may have a multi-layered structure, in which single-crystalline α-phase layer and polycrystalline γ-phase layer are stacked.

A second electrode E2 may be provided on the fifth insulating layer 150. The second electrode E2 may be extended in the first direction D1, on the second surface SU2. The second electrode E2 may be connected to a portion of the second surface SU2, which is not veiled by the metal oxide pattern MOP (e.g., see FIG. 4B). The second electrode E2 may be an n-type electrode. The second electrode E2 may be electrically connected to the second power line PL2 previously described with reference to FIG. 2. In other words, the second power voltage ELVSS of FIG. 2 may be applied to the second electrode E2.

Each of the first and second electrodes E1 and E2 may be formed of or include at least one of conductive materials. The conductive materials may include indium zinc oxide (IZO), indium tin oxide (ITO), indium gallium oxide (IGO), indium zinc gallium oxide (IGZO), or combinations thereof. However, the inventive concept is not limited to this example. Alternatively, the conductive materials may include metallic materials including molybdenum, silver, titanium, copper, aluminum, or alloys thereof.

An electrical signal may be applied to the first surface SU1 of the light emitting device ED through the first electrode E1 and the connection pattern CP. The connection pattern CP may be in contact with the first surface SU1 of the light emitting device ED, but not the sidewall SW of the light emitting device ED. Thus, the electrical signal, which is applied to the first electrode E1, may not be supplied to the sidewall SW of the light emitting device ED.

The second electrode E2 may be in contact with only a portion of the second surface SU2, which is not veiled by the metal oxide pattern MOP. Thus, according to an embodiment of the inventive concept, a current between the first and second electrodes E1 and E2 may flow from the first surface SU1 of the light emitting device ED toward the second surface SU2 in a vertical direction (i.e., the third direction D3).

In the light emitting device ED, light may be mainly generated in the c-plane, which is the polar plane. In an embodiment, since the current flows from the first surface SU1 (i.e., the c-plane) toward the second surface SU2 (i.e., the c-plane), the current may be concentrated on the c-planes in the light emitting device ED. Thus, the light-emitting efficiency of the light emitting device ED may be improved.

A light-blocking pattern BM and a color filter CF may be provided on the second electrode E2. The light-blocking pattern BM may have an opening, which is vertically overlapped with the light emitting device ED, and the color filter CF may be provided in the opening. The light-blocking pattern BM may be a black matrix.

The color filter CF may include at least one of a red color filter, a green color filter, or a blue color filter. The color filter CF may be configured to transmit only light of a specific wavelength, among the light emitted from the light emitting device ED. As an example, the color filter CF may include quantum dots. That is, the color filter CF may be a quantum dot color filter.

As an example, the color filter CF may include a transparent material. If the light emitted from the light emitting device ED is a blue light, the color filter CF of a blue pixel may include only a transparent material, without a quantum dot.

A cover layer CV may be provided on the light-blocking pattern BM and the color filter CF. The cover layer CV may be formed of or include transparent glass or transparent plastic. The cover layer CV may protect the color filter CF and the light emitting device ED.

FIGS. 6A to 7C are sectional views illustrating a selective area growth according to an embodiment of the inventive concept.

Figure 6A:
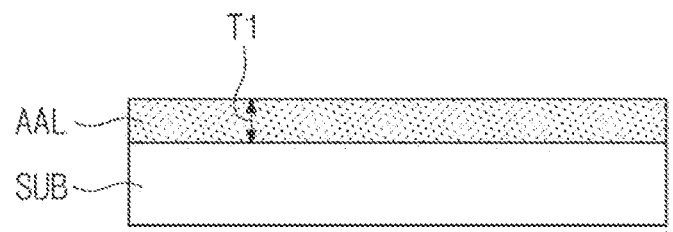
FIGS. 6A to 7C are sectional views illustrating a selective area growth according to an embodiment of the inventive concept.

Referring to FIG. 6A, an amorphous layer AAL may be formed on a substrate SUB. The substrate SUB may be a sapphire substrate, a silicon substrate, a SiC substrate, or a GaAs substrate. As an example, the substrate SUB may be a sapphire substrate (i.e., made of single-crystalline alumina).

The amorphous layer AAL may be formed using a chemical vapor deposition (CVD) process or an atomic layer deposition (ALD) process. The amorphous layer AAL may be formed of or include at least one of silica ($SiO_2$), alumina ($Al_2O_3$), titania ($TiO_2$), zirconia ($ZrO_2$), yttria ($Y_2O_3$)-zirconia, copper oxide, tantalum oxide, aluminum nitride (AlN), or silicon nitride ($Si_3N_4$). As an example, the amorphous layer AAL may be formed of or include amorphous alumina.

The amorphous layer AAL may be formed to have a first thickness T1. The first thickness T1 may be a relatively small thickness of 1 nm to 150 nm. In the case where the amorphous layer AAL is formed by the ALD process, the number of the cycling steps of the ALD process may be adjusted to be less than 1500 cycles.

Figure 6B:
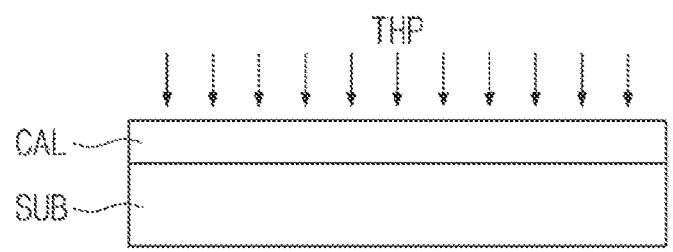

Referring to FIG. 6B, a thermal treatment process THP may be performed on the amorphous layer AAL. The thermal treatment process THP may be performed at a temperature of 750° ° C. to 1200° C. As a result of the thermal treatment process THP, the amorphous layer AAL may be crystallized to form a single-crystalline layer CAL of a single-crystalline structure. For example, the single-crystalline layer CAL may be an alumina layer having a single-crystalline α-phase. The single-crystalline layer CAL may have the same material and crystalline phase as the substrate SUB.

Figure 6C:
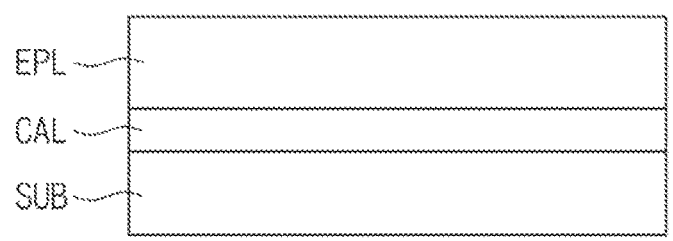

Referring to FIG. 6C, an epitaxial layer EPL may be grown from the single-crystalline layer CAL by a metal organic chemical vapor deposition (MOCVD), in which the single-crystalline layer CAL is used as a seed layer. The MOCVD process may be performed at a temperature of 750° C. to 1200° C. The epitaxial layer EPL may have a relatively high growth rate on the single-crystalline layer CAL of the single-crystalline α-phase. Thus, on the single-crystalline layer CAL, the epitaxial layer EPL may be formed to have a relatively large thickness. For example, the epitaxial layer EPL may be a GaN or $Ga_2O_3$ layer.

Figure 7A:
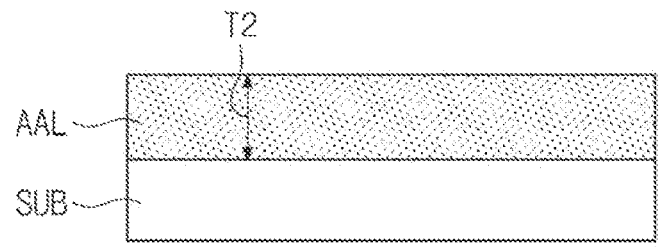

Referring to FIG. 7A, an amorphous layer AAL may be formed on a substrate SUB. The amorphous layer AAL may be formed to a second thickness T2. The second thickness T2 may be larger than the first thickness T1 described above. The second thickness T2 may be a relatively large thickness of 150 nm to 1000 nm. For example, the second thickness T2 may range from 200 nm to 800 nm. If the amorphous layer AAL is formed by an ALD process, the number of the cycling steps of the ALD process may be adjusted to be greater than 1500 cycles.

Figure 7B:
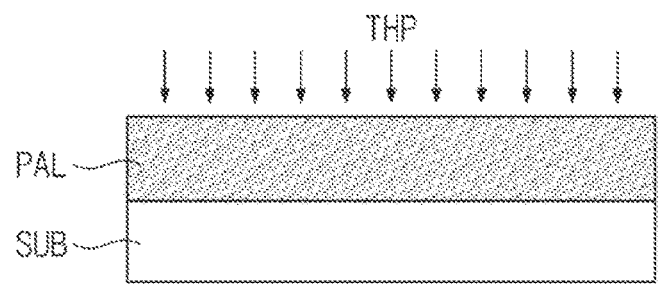

Referring to FIG. 7B, the thermal treatment process THP may be performed on the amorphous layer AAL. The thermal treatment process THP may be performed at a temperature of 750° C. to 1200° C. As a result of the thermal treatment process THP, the amorphous layer AAL may be crystallized to form a polycrystalline layer PAL. For example, the polycrystalline layer PAL may be an alumina layer having a polycrystalline γ-phase. The polycrystalline layer PAL may have a crystalline phase that is different from the substrate SUB.

In the present embodiment, since the amorphous layer AAL has a relatively large thickness (e.g., the second thickness T2), the crystallization of the amorphous layer AAL by the substrate SUB may not be sufficiently performed. Thus, the amorphous layer AAL may be transformed to the polycrystalline layer PAL, not to a single-crystalline layer.

Figure 7C:
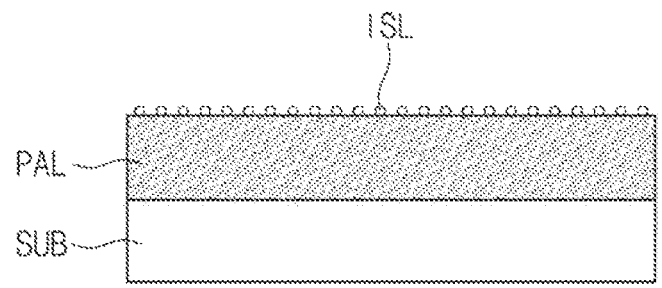

Referring to FIG. 7C, a MOCVD process, in which the polycrystalline layer PAL is used as a seed layer, may be performed to form island-shaped grains ISL on the polycrystalline layer PAL.

An epitaxial growth rate on the polycrystalline layer PAL may be much slower than that on the single-crystalline layer CAL.' Thus, an epitaxial layer EPL on the single-crystalline layer CAL of FIG. 6C may be formed to have a relatively large thickness, whereas on the polycrystalline layer PAL of FIG. 7C, the grains ISL or a thin epitaxial layer may be formed, even when the MOCVD process is performed under the same condition.

Since, as described above, the growth rate of the epitaxial layer depends on a crystal structure of the seed layer, the epitaxial layer may be hardly grown on a polycrystalline region and may be selectively grown on only a single-crystalline region. The selective area growth (SAG) may represent this process.

FIGS. 8, 10, 12, 14, 16, 18, and 20 are plan views illustrating a method of manufacturing a patterned substrate, according to an embodiment of the inventive concept. FIGS. 9A, 11A, 13A, 15A, 17A, 19A, and 21A are sectional views taken along lines A-A' of FIGS. 8, 10, 12, 14, 16, 18, and 20, respectively. FIGS. 9B, 11B, 13B, 15B, 17B, 19B, and 21B are sectional views taken along lines B-B' of FIGS. 8, 10, 12, 14, 16, 18, and 20, respectively.

Figure 8:
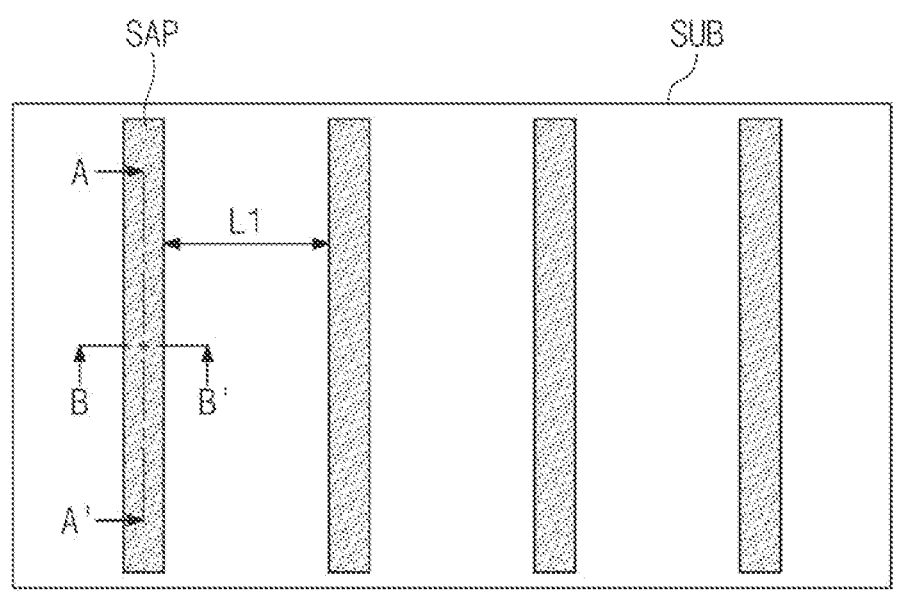
FIGS. 8, 10, 12, 14, 16, 18, and 20 are plan views illustrating a method of manufacturing a patterned substrate, according to an embodiment of the inventive concept.
Figure 8:
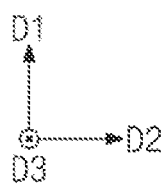
Figure 9A:
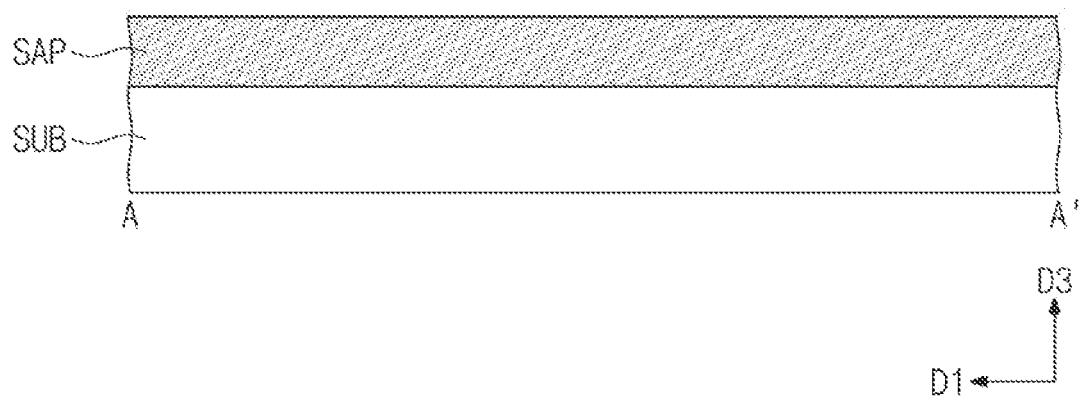
FIGS. 9A, 11A, 13A, 15A, 17A, 19A, and 21A are sectional views taken along lines A-A' of FIGS. 8, 10, 12, 14, 16, 18, and 20, respectively.
Figure 9B:
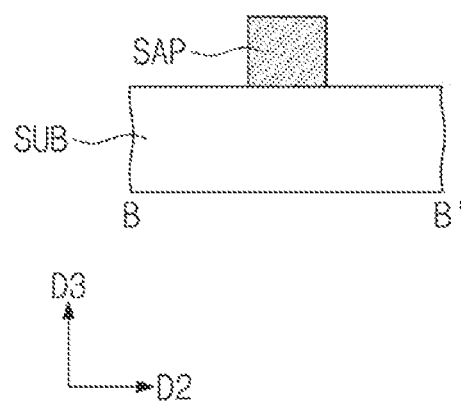
FIGS. 9B, 11B, 13B, 15B, 17B, 19B, and 21B are sectional views taken along lines B-B' of FIGS. 8, 10, 12, 14, 16, 18, and 20, respectively.

Referring to FIGS. 8, 9A, and 9B, a plurality of sacrificial patterns SAP may be formed on a substrate SUB. The substrate SUB may be a sapphire substrate, a silicon substrate, a SiC substrate, or a GaAs substrate. As an example, the substrate SUB may be a sapphire substrate. For example, the substrate SUB may be formed of or include alumina of single-crystalline α-phase.

The formation of the sacrificial patterns SAP may include forming a photoresist layer on the substrate SUB and performing exposing and developing processes on the photoresist layer. In other words, the sacrificial patterns SAP may include a photoresist material.

Each of the sacrificial patterns SAP may be a line-shaped pattern extending in a first direction D1. The sacrificial patterns SAP may be arranged with a specific pitch in a second direction D2. A line width of each of the sacrificial patterns SAP may be smaller than a distance L1 between adjacent ones of the sacrificial patterns SAP. In an embodiment, the distance L1 may be about 500 nm.

Figure 10:
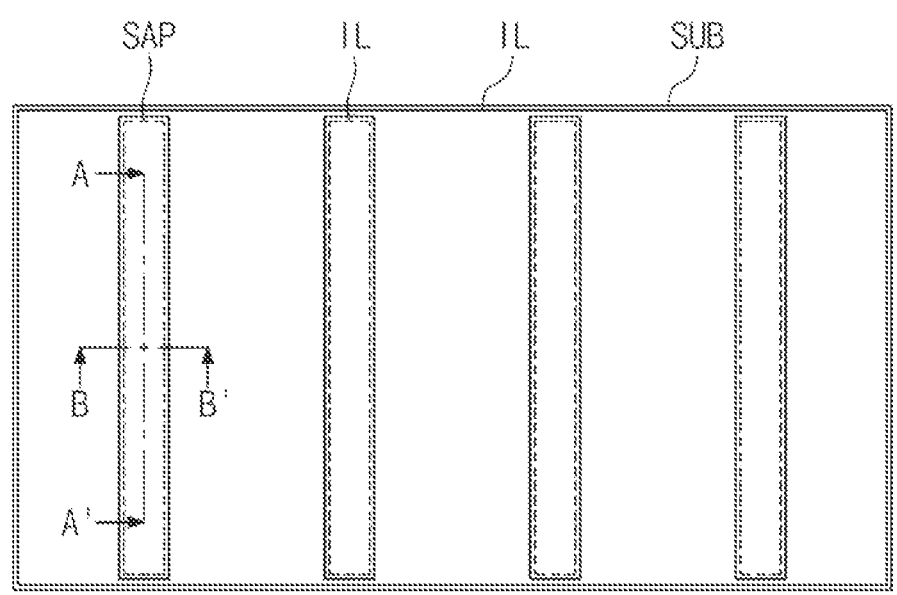
Figure 10:
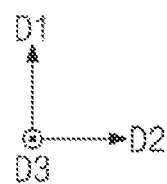
Figure 11A:
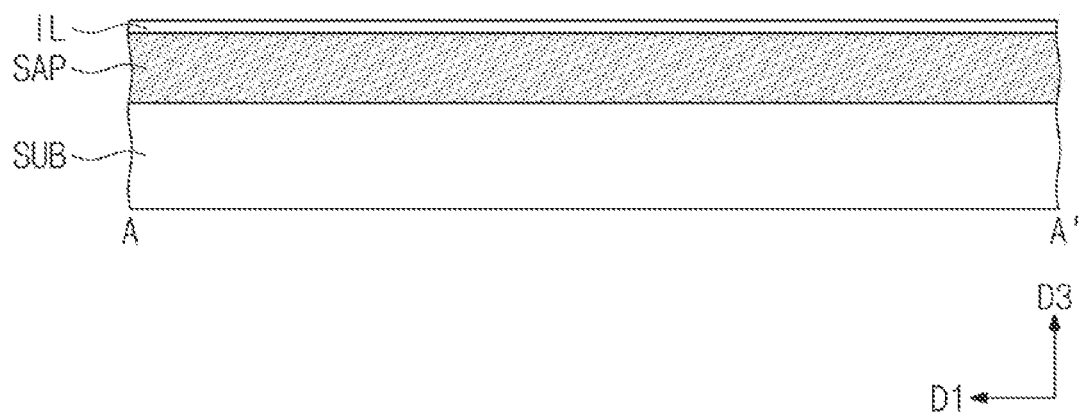
Figure 11B:
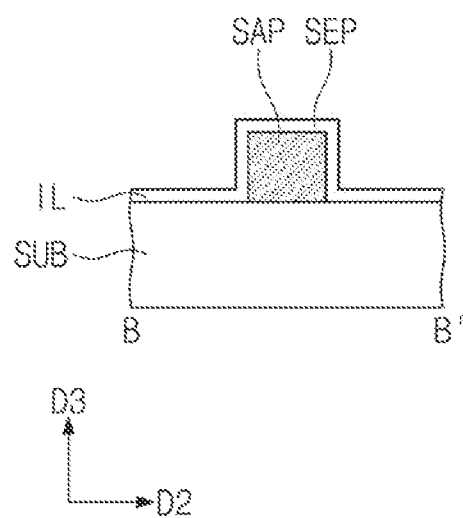

Referring to FIGS. 10, 11A, and 11B, an inorganic layer IL may be conformally formed on the substrate SUB. The formation of the inorganic layer IL may include performing an atomic layer deposition process or a chemical vapor deposition process. The inorganic layer IL may be formed of or include at least one of silica ($SiO_2$), alumina ($Al_2O_3$), titania ($TiO_2$), zirconia ($ZrO_2$), yttria ($Y_2O_3$)-zirconia, copper oxide, tantalum oxide, aluminum nitride (AlN), or silicon nitride ($Si_3N_4$). As an example, the inorganic layer IL may be formed of or include amorphous alumina.

The inorganic layer IL may cover a top surface of the substrate SUB and a surface of each of the sacrificial patterns SAP. In other words, a portion of the inorganic layer IL may cover the surface of the sacrificial pattern SAP. The inorganic layer IL covering the surface of the sacrificial pattern SAP may be defined as a seed pattern SEP.

A planar shape of the seed pattern SEP may be determined by the sacrificial pattern SAP. For example, the seed pattern SEP may have substantially the same planar shape as the sacrificial pattern SAP.

Figure 12:
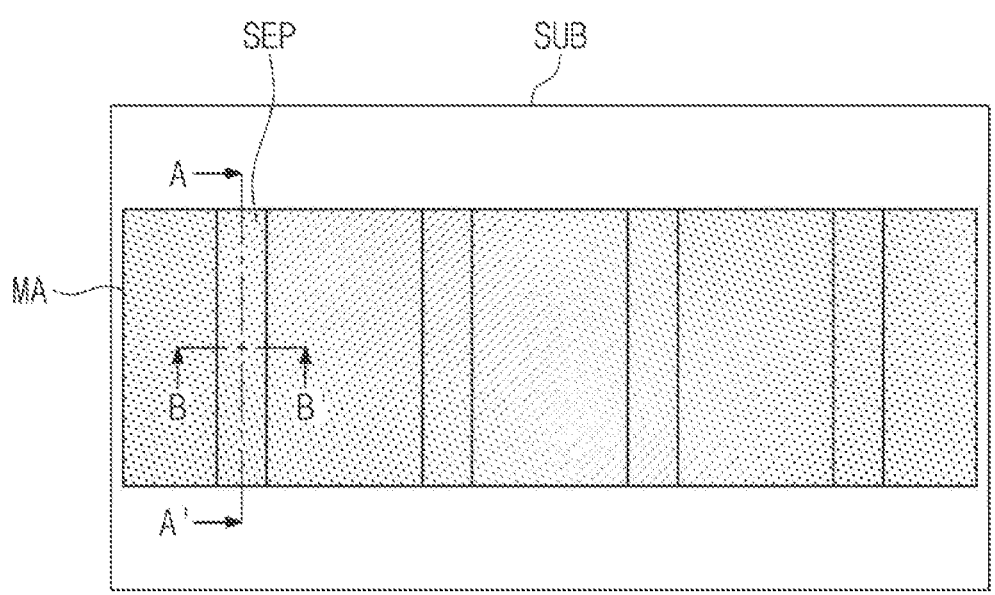
Figure 12:
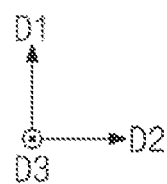
Figure 13A:
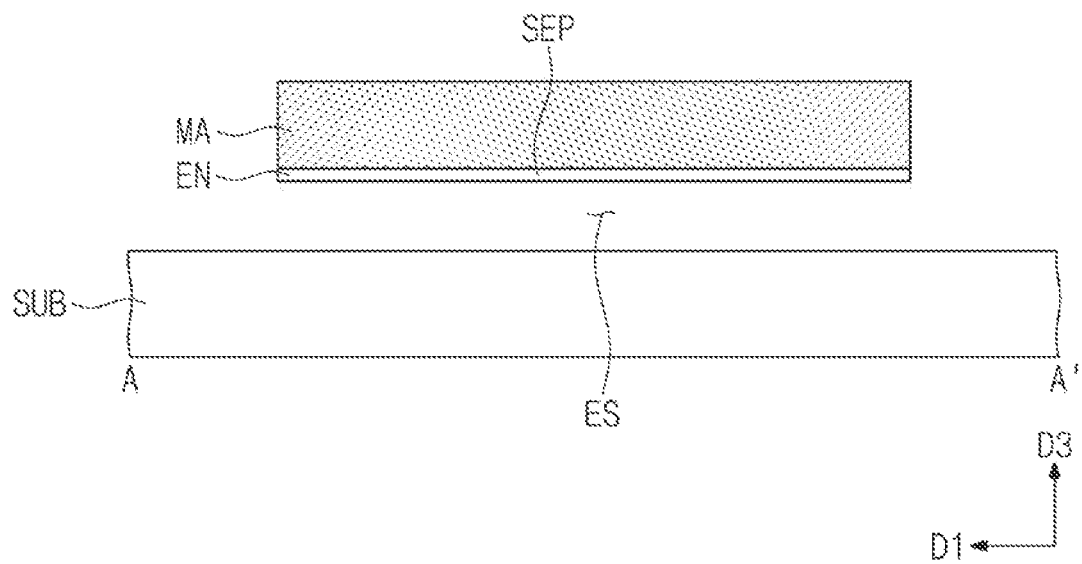
Figure 13B:
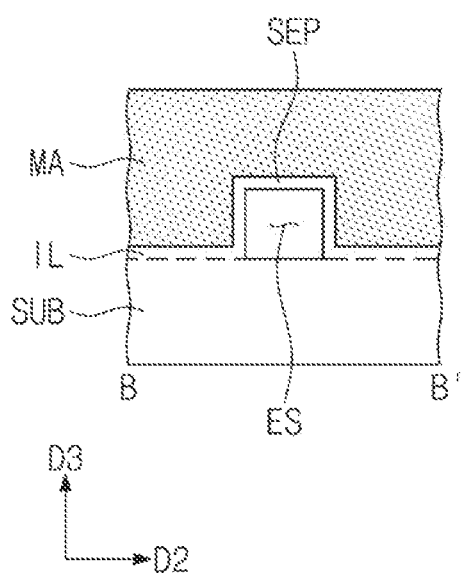

Referring to FIGS. 12, 13A, and 13B, a mask layer MA may be formed on the inorganic layer IL. The inorganic layer IL and the sacrificial patterns SAP, which are exposed, may be removed using the mask layer MA as an etch mask. As a result, the seed pattern SEP may be left in a region overlapped with the mask layer MA.

The sacrificial pattern SAP, which is exposed near an end portion EN of the seed pattern SEP, may be selectively removed. For example, the sacrificial pattern SAP may be removed in a thermolysis manner through a thermal treatment process. As a result, only the inorganic layer IL including the seed pattern SEP may be left. An empty space ES may be defined between the seed pattern SEP and the substrate SUB.

Thereafter, a first thermal treatment process may be performed on the inorganic layer IL to crystallize the inorganic layer IL and the seed pattern SEP. In detail, the first thermal treatment process may be performed at a temperature of about 1000° C. to 1200° ° C. The first thermal treatment process may be performed at a temperature, where the inorganic layer IL can be transformed to a single-crystalline α-phase. The first thermal treatment process may be performed until the whole of the seed pattern SEP has the single-crystalline α-phase.

As a result of the crystallization of the inorganic layer IL, the inorganic layer IL may form a single-crystalline alumina that is the same as the substrate SUB. In other words, the inorganic layer IL may become a part of the substrate SUB. For example, the substrate SUB may have a protruding shape whose top surface is defined by the seed pattern SEP. Next, the mask layer MA may be selectively removed.

Figure 14:
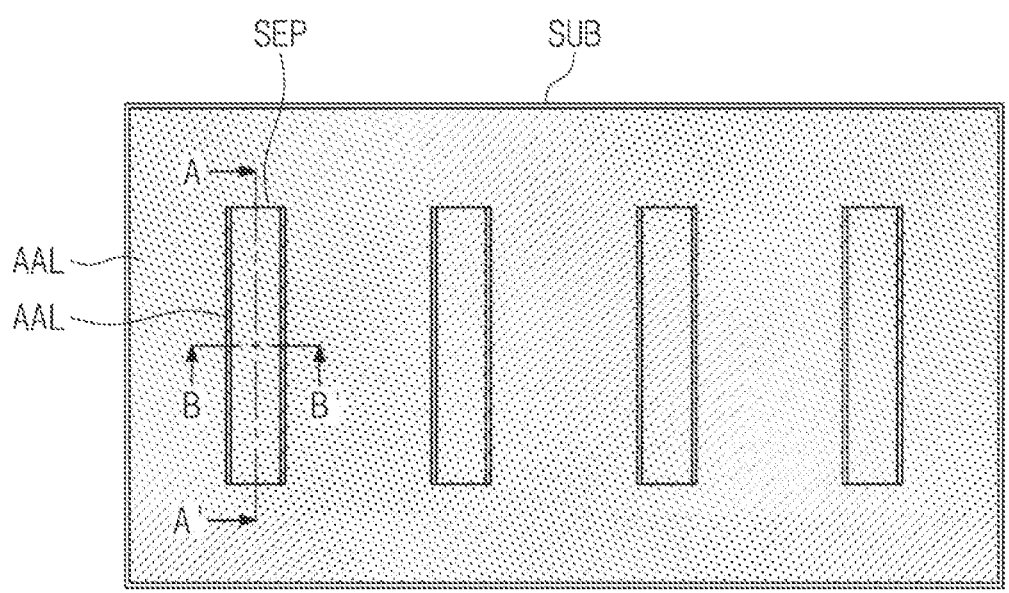
Figure 14:
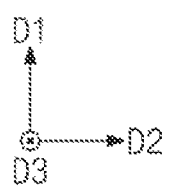
Figure 15A:
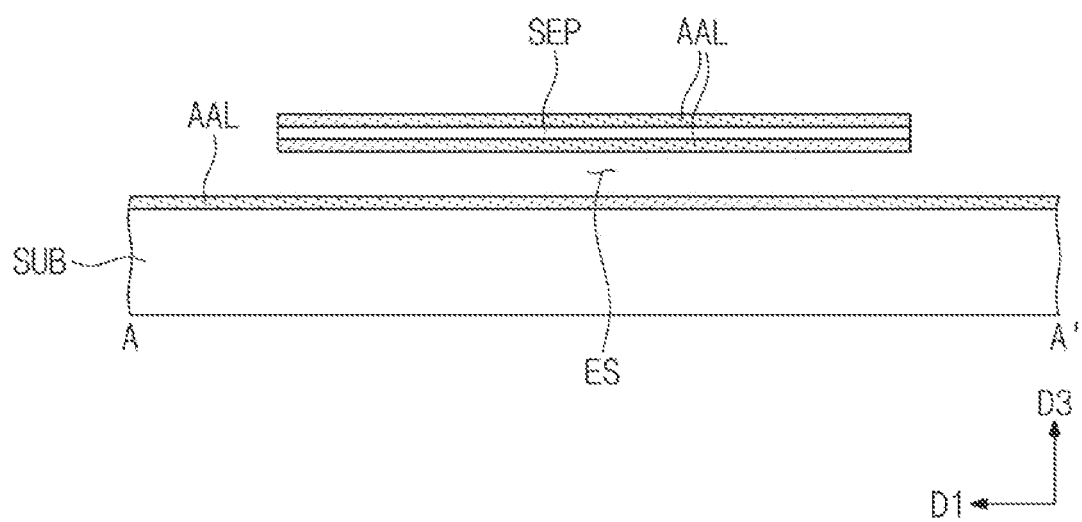
Figure 15B:
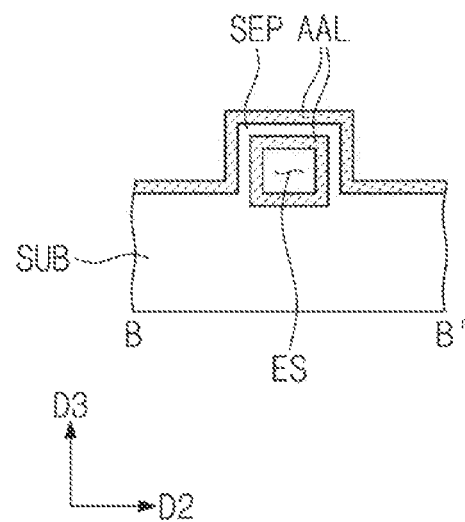

Referring to FIGS. 14, 15A, and 15B, an amorphous layer AAL may be conformally formed on the substrate SUB. The amorphous layer AAL may be formed to partially fill the empty space ES between the seed pattern SEP and the substrate SUB. The amorphous layer AAL may be formed to have substantially the same features as that described with reference to FIGS. 6A to 7C. For example, the amorphous layer AAL may be formed by an ALD process. In the present embodiment, the amorphous layer AAL may be an amorphous alumina having the second thickness T2 of 150 nm to 1000 nm (e.g., see FIG. 7A).

Figure 16:
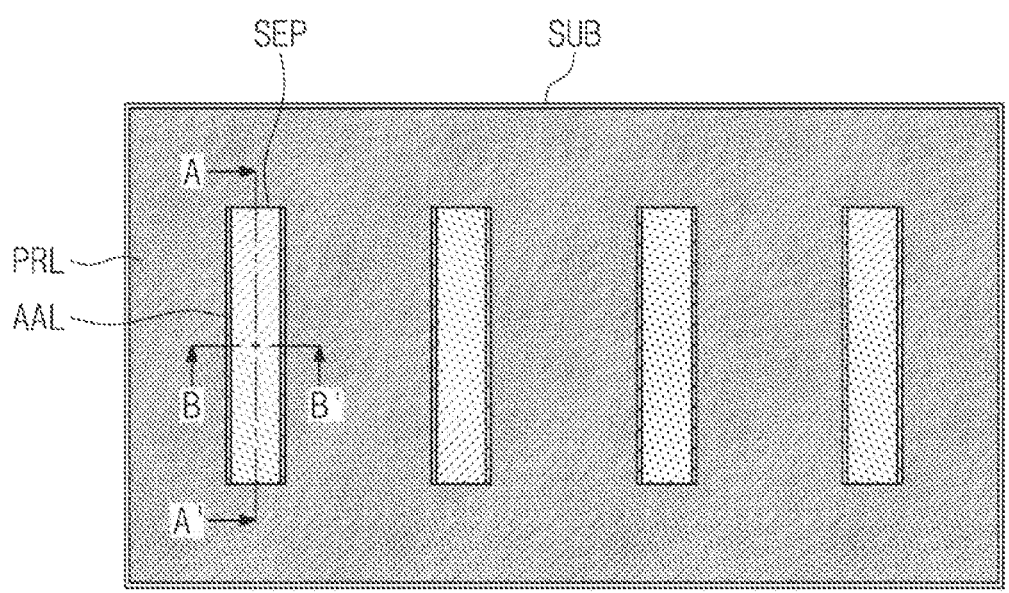
Figure 16:
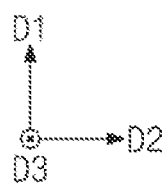
Figure 17A:
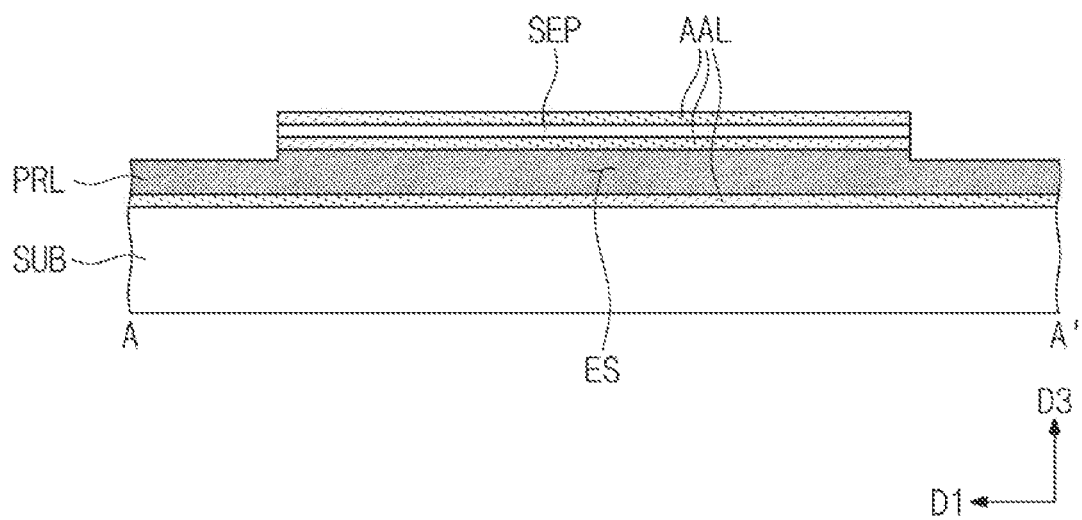
Figure 17B:
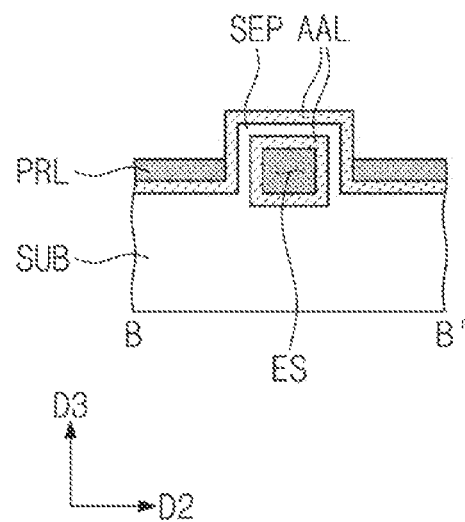

Referring to FIGS. 16, 17A, and 17B, a photoresist layer PRL may be formed on the substrate SUB. The photoresist layer PRL may be formed to completely fill the empty space ES between the seed pattern SEP and the substrate SUB. The photoresist layer PRL may be recessed to expose the seed pattern SEP and the amorphous layer AAL covering the same. Thus, the substrate SUB and the amorphous layer AAL, which is in contact with the substrate SUB, may be covered with the photoresist layer PRL, but the seed pattern SEP and the amorphous layer AAL, which is in contact with the seed pattern SEP, may be selectively exposed.

Figure 18:
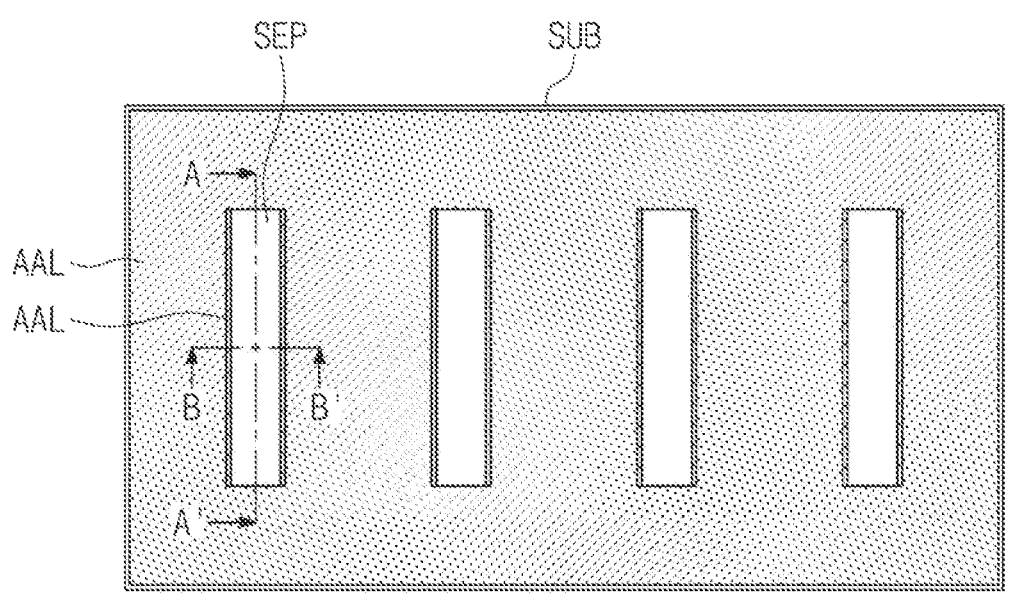
Figure 18:
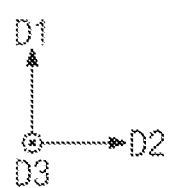
Figure 19A:
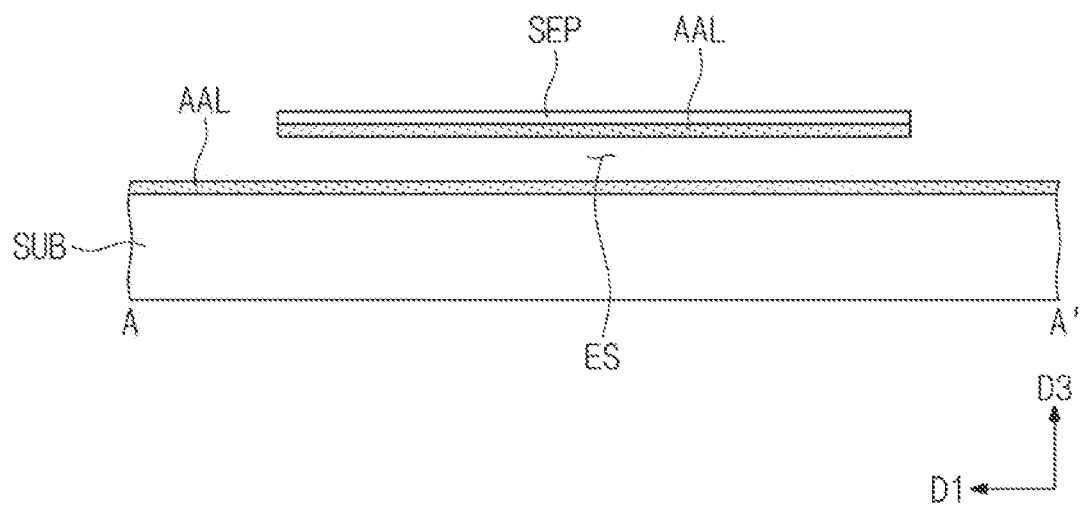
Figure 19B:
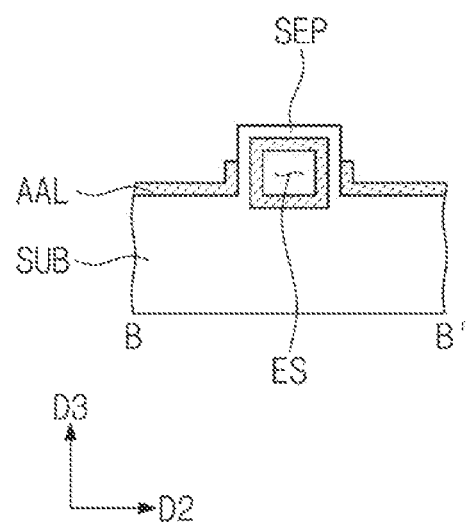

Referring to FIGS. 18, 19A, and 19B, the amorphous layer AAL, which is not covered with the photoresist layer PRL, may be selectively removed. Thus, a top surface of the seed pattern SEP may be exposed. Next, the photoresist layer PRL may be selectively removed. Accordingly, the amorphous layer AAL may cover the substrate SUB but may expose the top surface of the seed pattern SEP.

Figure 20:
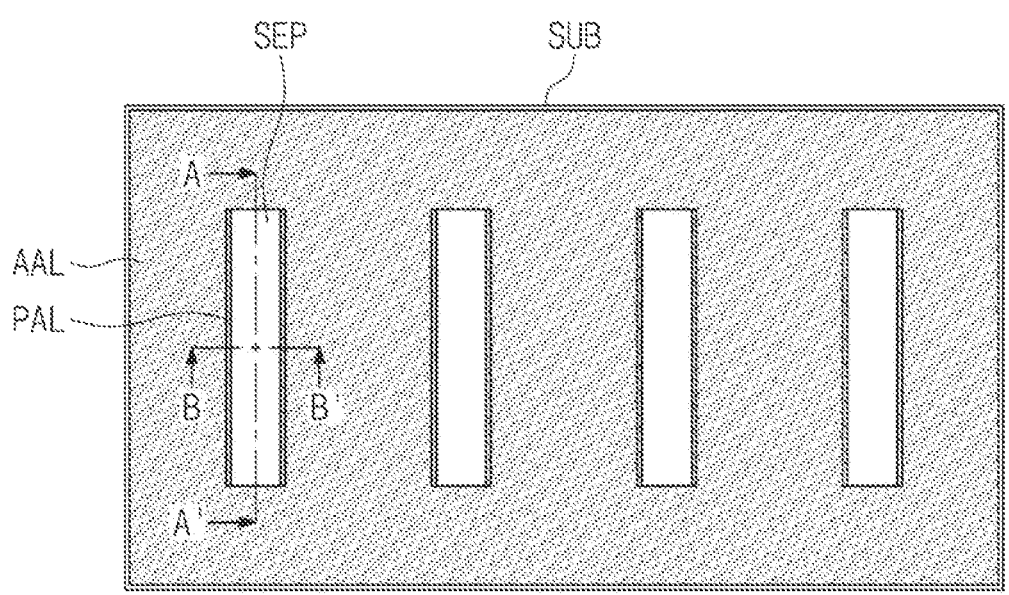
Figure 20:
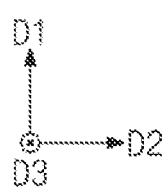
Figure 21A:
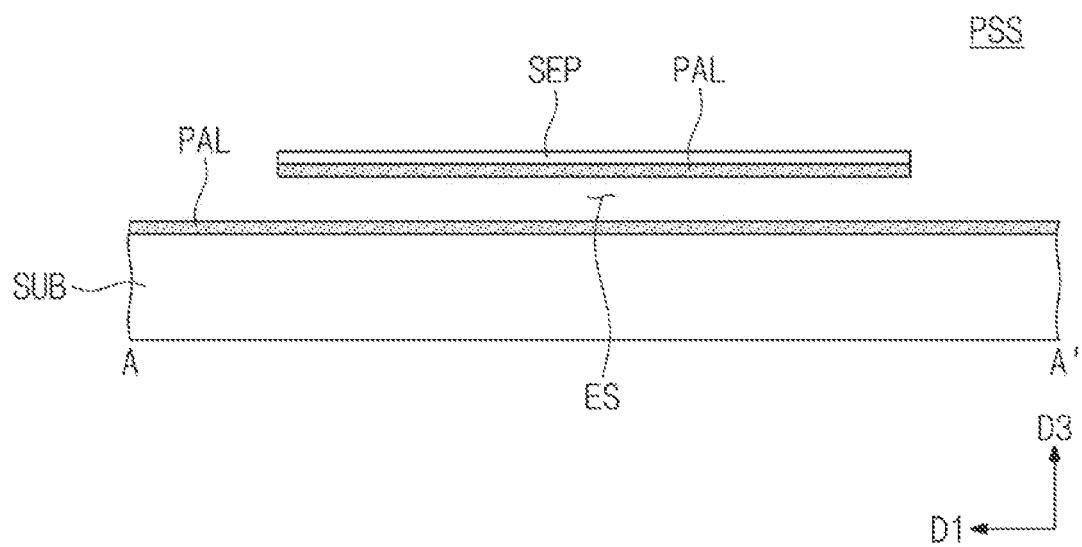
Figure 21B:
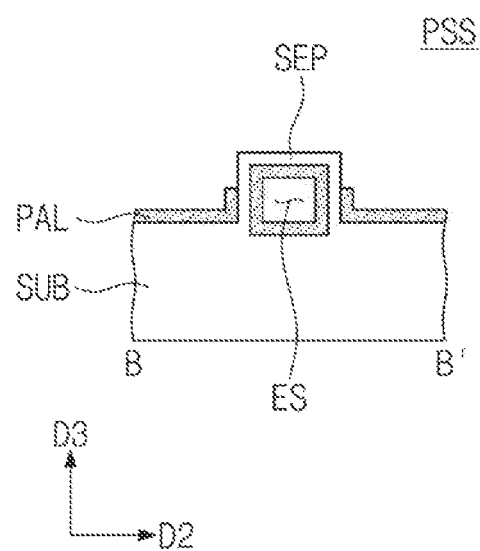

Referring to FIGS. 20, 21A, and 21B, a second thermal treatment process may be performed on the amorphous layer AAL to crystallize the amorphous layer AAL. Accordingly, a polycrystalline layer PAL may be formed to have a polycrystalline γ-phase.

The second thermal treatment process may be performed at a temperature of 750° C. to 1200° C. (in particular, of 750° ° C. to 900° C.). In the case where, as previously described with reference to FIGS. 7A and 7B, the amorphous layer AAL has a relatively large thickness (e.g., the second thickness T2), the amorphous layer AAL may be transformed to the polycrystalline layer PAL by the second thermal treatment process. Meanwhile, the polycrystalline layer PAL may expose the seed pattern SEP of the single-crystalline α-phase.

As a result, according to the present embodiment, a patterned substrate PSS (e.g., a patterned sapphire substrate) may be prepared to include the seed pattern SEP of the single-crystalline α-phase and the polycrystalline layer PAL of the polycrystalline γ-phase. An epitaxial layer to be described below may be effectively grown from a single-crystalline layer (e.g., the seed pattern SEP) but may be hardly grown from the polycrystalline layer PAL (e.g., see FIGS. 6C and 7C). That is, according to an embodiment of the inventive concept, it may be possible to provide the patterned substrate PSS capable of realizing the selective area growth (SAG) described above.

Figure 22:
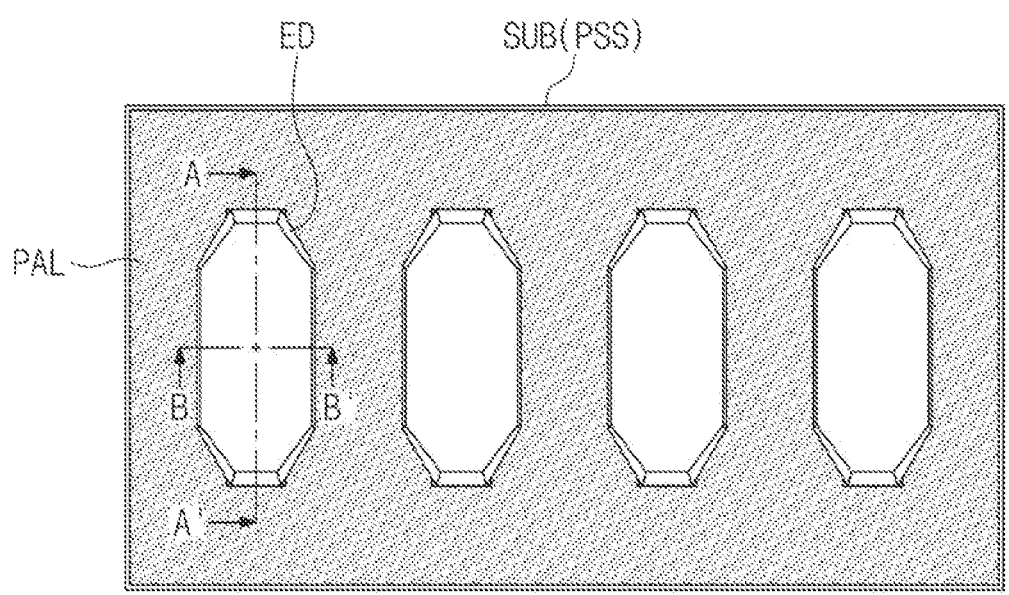
FIG. 22 is a plan view illustrating a method of manufacturing a light emitting device according to an embodiment of the inventive concept.
Figure 23A:
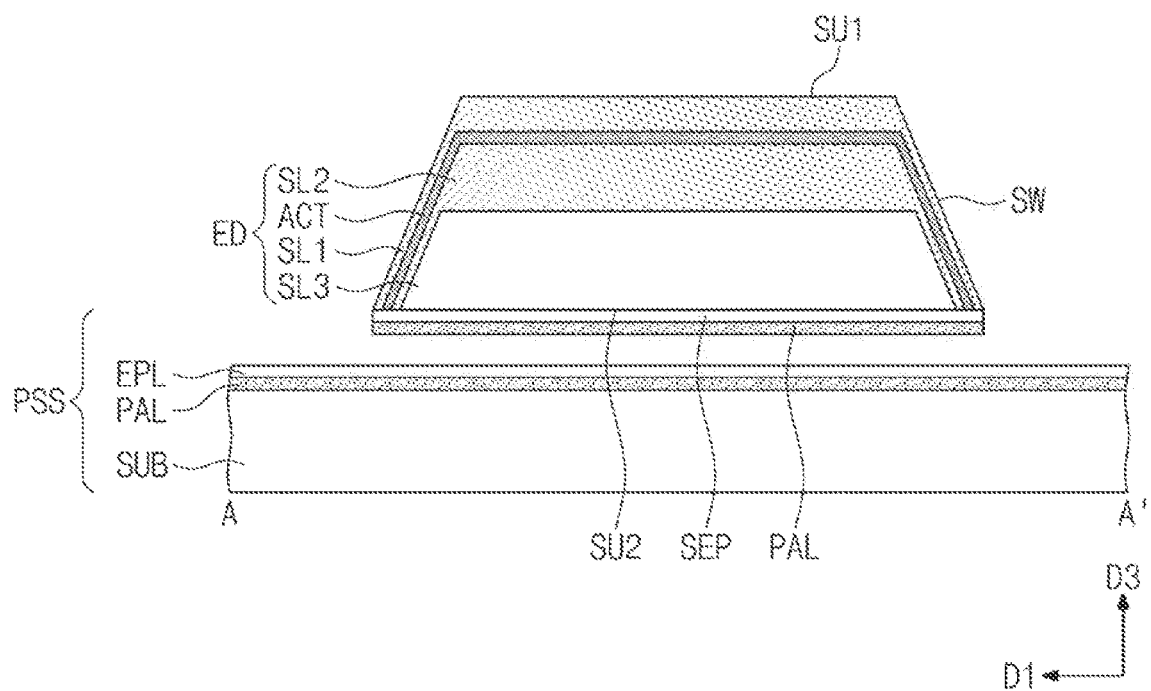
FIG. 23A is a sectional view taken along a line A-A' of FIG. 22.
Figure 23B:
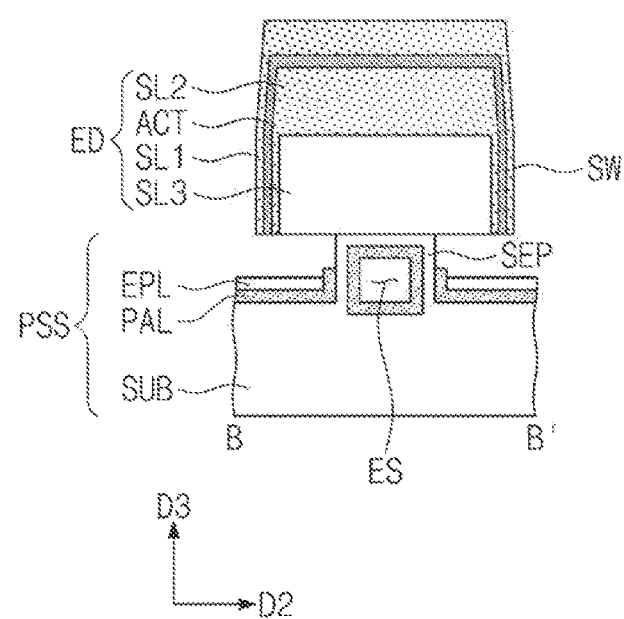
FIG. 23B is a sectional view taken along a line B-B' of FIG. 22.

FIG. 22 is a plan view illustrating a method of manufacturing a light emitting device according to an embodiment of the inventive concept. FIG. 23A is a sectional view taken along a line A-A' of FIG. 22. FIG. 23B is a sectional view taken along a line B-B' of FIG. 22.

Referring to FIGS. 22, 23A, and 23B, the patterned substrate PSS may be prepared by the afore-described method. Light emitting devices ED may be respectively formed on the seed patterns SEP of the patterned substrate PSS. A plurality of light emitting devices ED may be two-dimensionally formed to correspond to the seed patterns SEP, which are two-dimensionally arranged. In an embodiment, the light emitting device ED according to the present embodiment may be grown to have an octagonal shape, when viewed in a plan view.

In an embodiment, the light emitting device ED may be formed by a MOCVD process. In detail, the MOCVD process may be performed on the single-crystalline seed pattern SEP, an epitaxial structure (e.g., the light emitting device ED) may be grown using a top surface of the seed pattern SEP as a seed layer. The light emitting device ED may be formed of or include at least one of III-V compound semiconductor materials (e.g., GaN, AlN, AlGaN, InGaN, InN, InAlGaN, AlInN, or combinations thereof). On the seed pattern SEP, the epitaxial structure or the light emitting device ED may be rapidly grown in a direction (i.e., a third direction D3).

The light emitting device ED of a multi-layered structure may be formed by adjusting a source gas, a process temperature, and a chamber pressure in the MOCVD process. For example, the formation of the light emitting device ED may include forming a third semiconductor layer SL3 on the seed pattern SEP, forming a second semiconductor layer SL2 on the third semiconductor layer SL3, forming an active layer ACT on the second semiconductor layer SL2, and forming a first semiconductor layer SL1 on the active layer ACT.

In detail, the third semiconductor layer SL3 may be formed to include a GaN layer. The second semiconductor layer SL2 may be formed to include a GaN layer doped with impurities (e.g., silicon (Si), germanium (Ge), tin (Sn), selenium (Se), or tellurium (Te)). The active layer ACT may be formed to have a multiple quantum well structure including an InGaN layer and a GaN layer. The first semiconductor layer SL1 may be formed to include a GaN layer doped with impurities (e.g., magnesium (Mg), zinc (Zn), calcium (Ca), strontium (Sr), or barium (Ba)). The active layer ACT and the first to third semiconductor layers SL1, SL2, and SL3 may be successively formed in a single deposition chamber.

The light emitting device ED may have a second surface SU2, which is in contact with the seed pattern SEP, a first surface SU1, which is opposite to the second surface SU2 in the third direction D3, and a sidewall SW, which is slantingly extended from the second surface SU2 to the first surface SU1. The sidewall SW may be a non-etching surface, which is formed by an epitaxial growth process, not by an etching process.

In a comparative example, the light emitting device may be formed by patterning a GaN layer, which is formed by an epitaxial growth process, using a plasma etching method. In this case, the sidewall of the light emitting device may be an etching surface, which is formed by the etching method, and may be different from a crystal facet in the afore-described embodiment. For example, in the case where the sidewall of the light emitting device is formed by a plasma etching method, defects, such as non-radiative recombination, may occur on the resultant etched surface. Such defects may lead to deterioration in performance (e.g., external quantum efficiency (EQE)) of the light emitting device. The deterioration of the EQE characteristic may become more and more problematic as a size of the light emitting device decreases. Furthermore, in the case where the sidewall of the light emitting device is the etched surface, a problem of leakage current may occur in the light emitting device.

According to an embodiment of the inventive concept, the sidewall SW of the light emitting device ED may be formed by an epitaxial growth process, not by a plasma etching process. This mean that the sidewall SW is a substantially perfect crystal facet that is not damaged by plasma. Thus, in the light emitting device ED according to the present embodiment, it may be possible to realized improved performance and to prevent the problem of leakage current.

During the MOCVD process, an epitaxial layer EPL may be grown to have a very small thickness on the polycrystalline layer PAL having the polycrystalline γ-phase. A growth rate of an epitaxial layer may be much higher on the seed pattern SEP having the single-crystalline structure than on the polycrystalline layer PAL having the polycrystalline γ-phase. Thus, the epitaxial layer EPL on the polycrystalline layer PAL may be much thinner than the light emitting device ED on the seed pattern SEP. The epitaxial layer EPL on the polycrystalline layer PAL may not be in contact with the light emitting device ED and may be completely spaced apart from the light emitting device ED.

Figure 24:
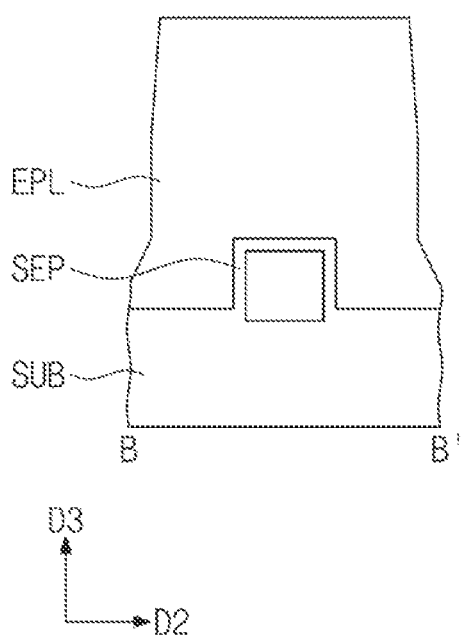
FIG. 24 is a sectional view illustrating a metal organic chemical vapor deposition process, according to a comparative example of the inventive concept.

FIG. 24 is a sectional view illustrating a MOCVD process, according to a comparative example of the inventive concept. FIG. 24 illustrates a structure of the epitaxial layer EPL, which is formed by a MOCVD process when the polycrystalline layer PAL is omitted from the patterned substrate PSS. The epitaxial layer EPL may be rapidly grown on both of the seed pattern SEP and the substrate SUB having the single-crystalline structure. Accordingly, a process failure may occur in which the epitaxial layer EPL is stuck to the substrate SUB.

By contrast, according to the embodiment of FIG. 23B, by using a selective area growth, in which the polycrystalline layer PAL and the seed pattern SEP have different growth rates, the epitaxial structure (e.g., the light emitting device ED) on the seed pattern SEP may be formed to be sufficiently spaced apart from the substrate SUB. As a result, it may be possible to prevent the process failure of FIG. 24 from occurring.

For the patterned substrate PSS according to the inventive concept, the selective area growth may be realized by using the polycrystalline layer PAL of polycrystalline alumina, not by a heterogeneous material, such as a silicon insulating layer (e.g., a silicon oxide layer or a silicon nitride layer). Accordingly, it may be possible to avoid a contamination issue of the light emitting device ED, which is caused by impurities from the heterogeneous material (e.g., by Si, O, and/or N from a silicon insulating layer), and thereby to prevent the purity of the light emitting device ED from being lowered. This may make it possible to further improve the light-emitting efficiency of the light emitting device ED.

Figure 25:
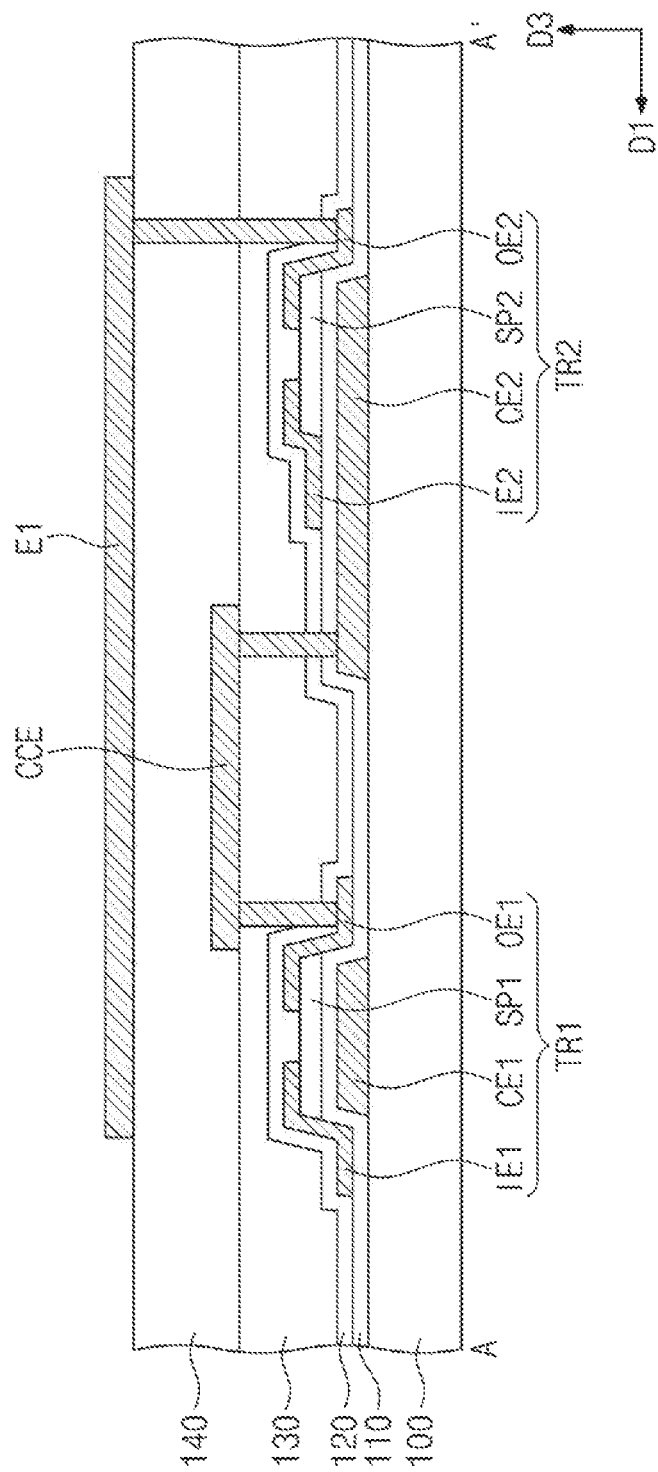
FIGS. 25 and 26 are sectional views illustrating a method of manufacturing a display device, according to an embodiment of the inventive concept.
Figure 26:
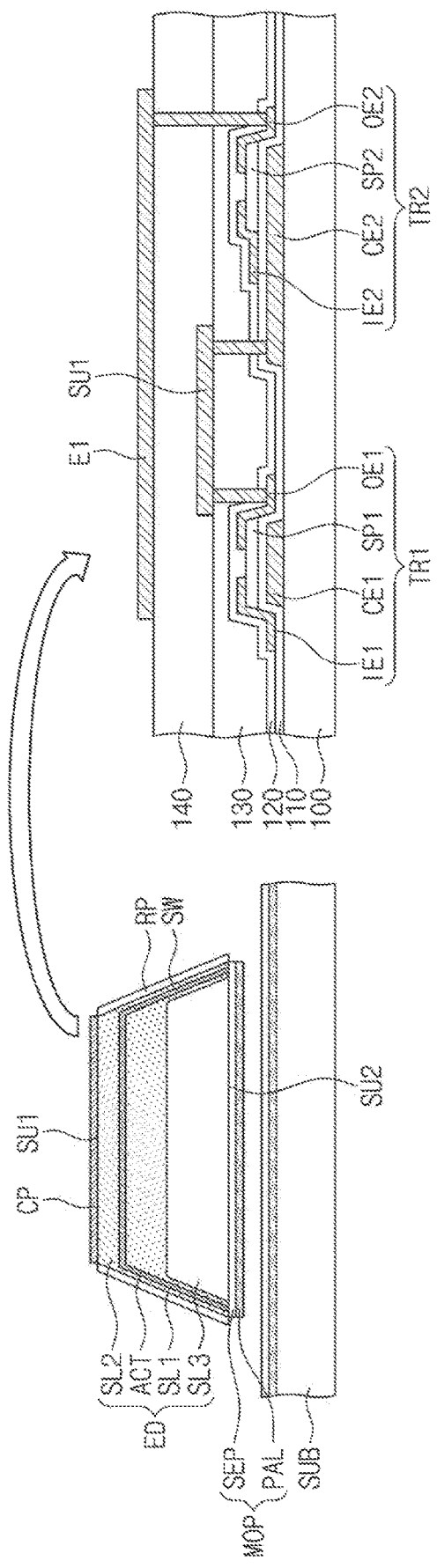

FIGS. 25 and 26 are sectional views illustrating a method of manufacturing a display device, according to an embodiment of the inventive concept.

Referring to FIG. 25, first and second thin-film transistors TR1 and TR2 may be formed on a base layer 100. The formation of the first and second thin-film transistors TR1 and TR2 may include performing a LTPS process or a LTPO process. A connection electrode CCE may be formed to electrically connect the first and second thin-film transistors TR1 and TR2 to each other. A first electrode E1 may be formed on the connection electrode CCE. The first electrode E1 may be electrically connected to the second thin-film transistor TR2. The first electrode E1 may be exposed to the outside.

Referring to FIG. 26, a reflection pattern RP and a connection pattern CP may be formed on the light emitting device ED described with reference to FIGS. 22, 23A, and 23B. The reflection pattern RP may be formed to selectively cover only the sidewall SW of the light emitting device ED. The connection pattern CP may be formed to selectively cover only the first surface SU1 of the light emitting device ED.

The light emitting device ED may be separated from the substrate SUB. The separation of the light emitting device ED may be achieved by a mechanical lift-off method. In an embodiment, during the mechanical lift-off process, the seed pattern SEP and the polycrystalline layer PAL on the second surface SU2 of the light emitting device ED may be maintained as they are, thereby forming a metal oxide pattern MOP partially covering the second surface SU2. In an embodiment, a portion or the entirety of the metal oxide pattern MOP may be removed in a subsequent process.

The separated light emitting device ED may be mounted on the first electrode E1. The separated light emitting device ED may be inverted and then may be disposed in such a way that the connection pattern CP thereof is placed on the first electrode E1.

Referring back to FIGS. 3, 4A and 4B, the fifth insulating layer 150 may be formed to cover the first electrode E1 and the light emitting device ED. A second electrode E2 may be formed on the fifth insulating layer 150. The second electrode E2 may be connected to a portion of the third semiconductor layer SL3 of the light emitting device ED, which is not veiled by the metal oxide pattern MOP.

A light-blocking pattern BM and a color filter CF may be formed on the second electrode E2. The light-blocking pattern BM may be a black matrix. The color filter CF may include at least one of a red color filter, a green color filter, or a blue color filter. A cover layer CV may be formed on the light-blocking pattern BM and the color filter CF.

In a method of manufacturing a display device according to an embodiment of the inventive concept, the light emitting device ED and the substrate SUB may be easily separated from each other by the mechanical lift-off method. Even when the light emitting device ED is separated from the substrate SUB, the metal oxide pattern MOP may still be attached to or left on the second surface SU2. In other words, the metal oxide pattern MOP may not be removed, and the light emitting device ED with the metal oxide pattern MOP may be directly used as a part of a display device. Thus, it may be unnecessary to perform an additional process of removing the metal oxide pattern MOP, and this may make it possible to reduce fabrication cost of the light emitting device ED. Such a metal oxide pattern MOP may be used to passivate the second surface SU2 of the light emitting device ED and may also provide a n-type contact between the second electrode E2 and the light emitting device ED.

Figure 27:
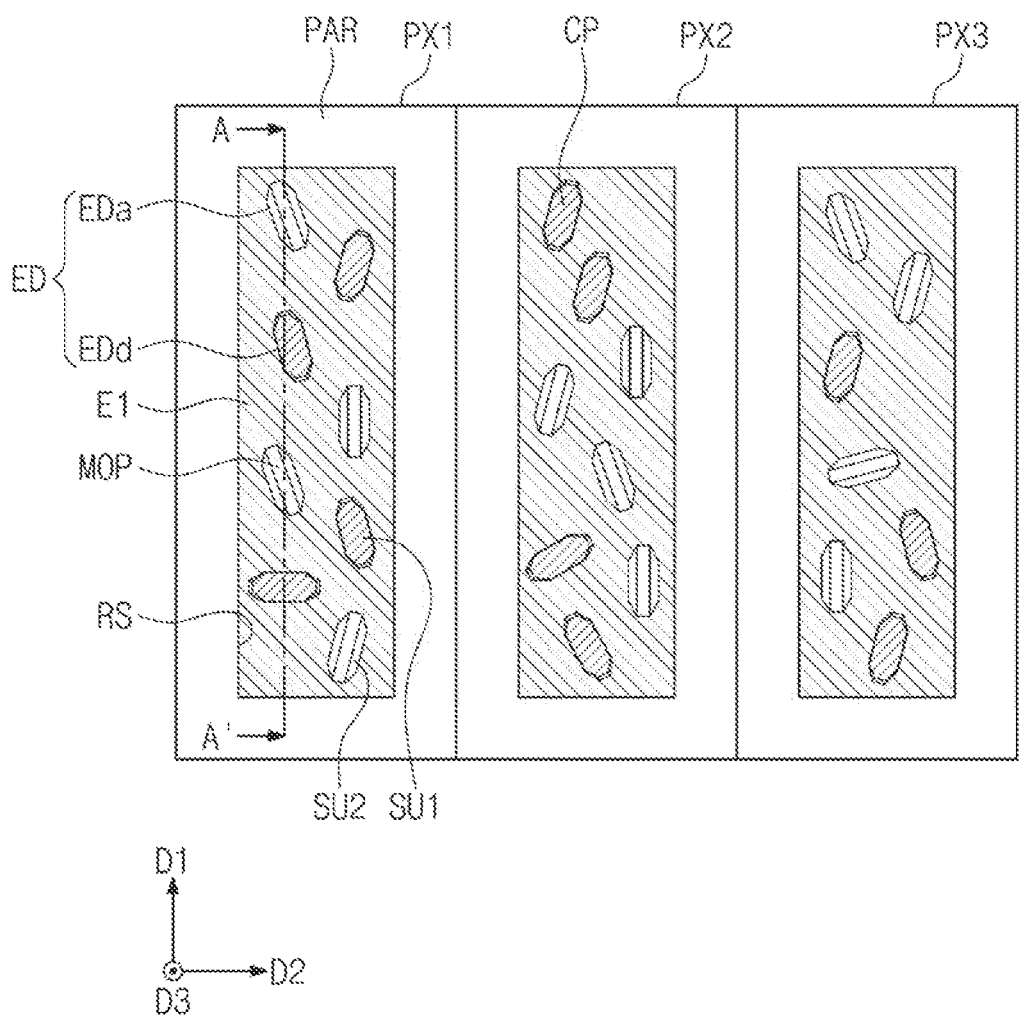
FIG. 27 is a plan view illustrating a display panel of a display device according to an embodiment of the inventive concept.
Figure 28:
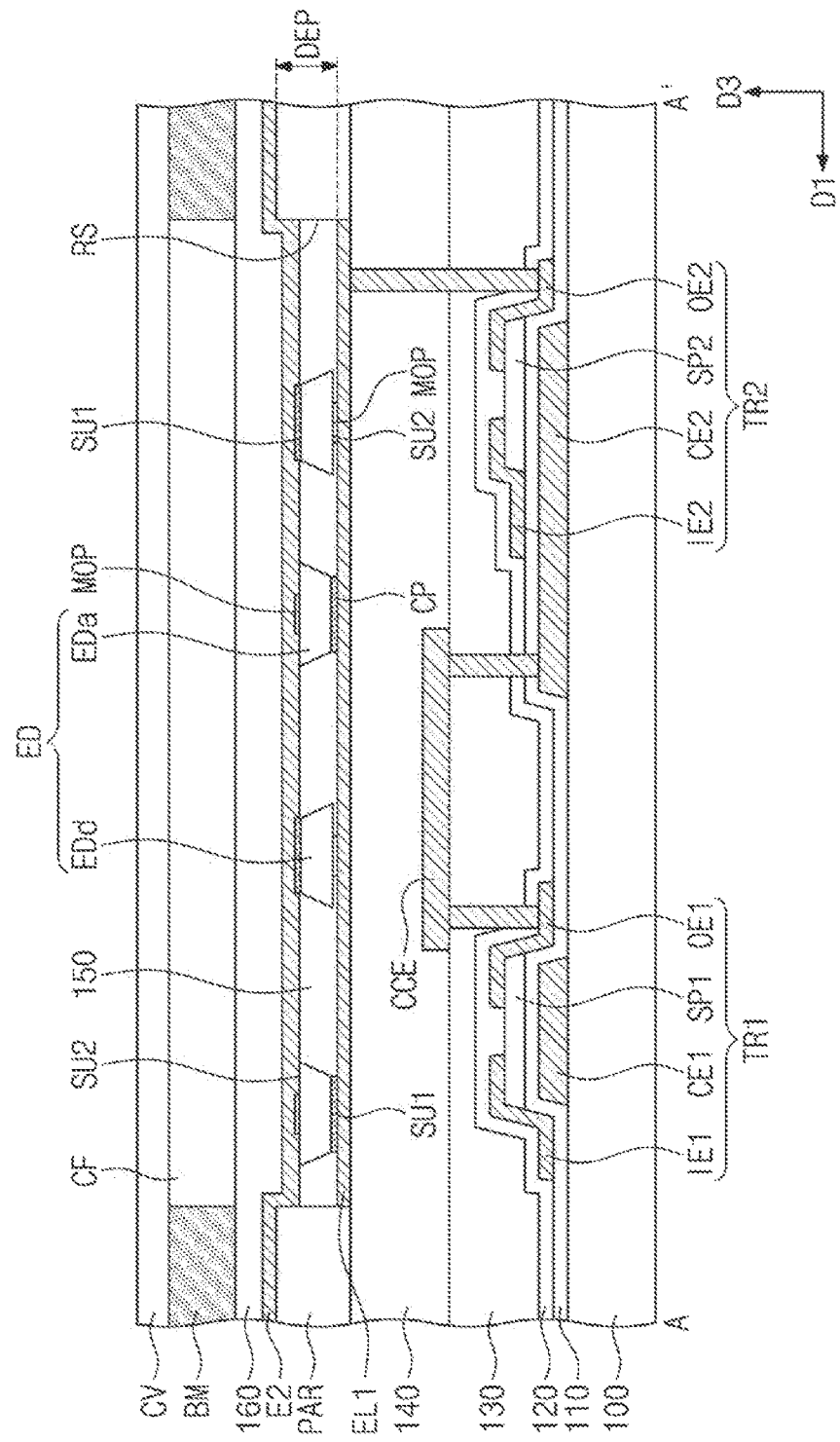
FIG. 28 is a sectional view taken along a line A-A' of FIG. 27.
Figure 29:
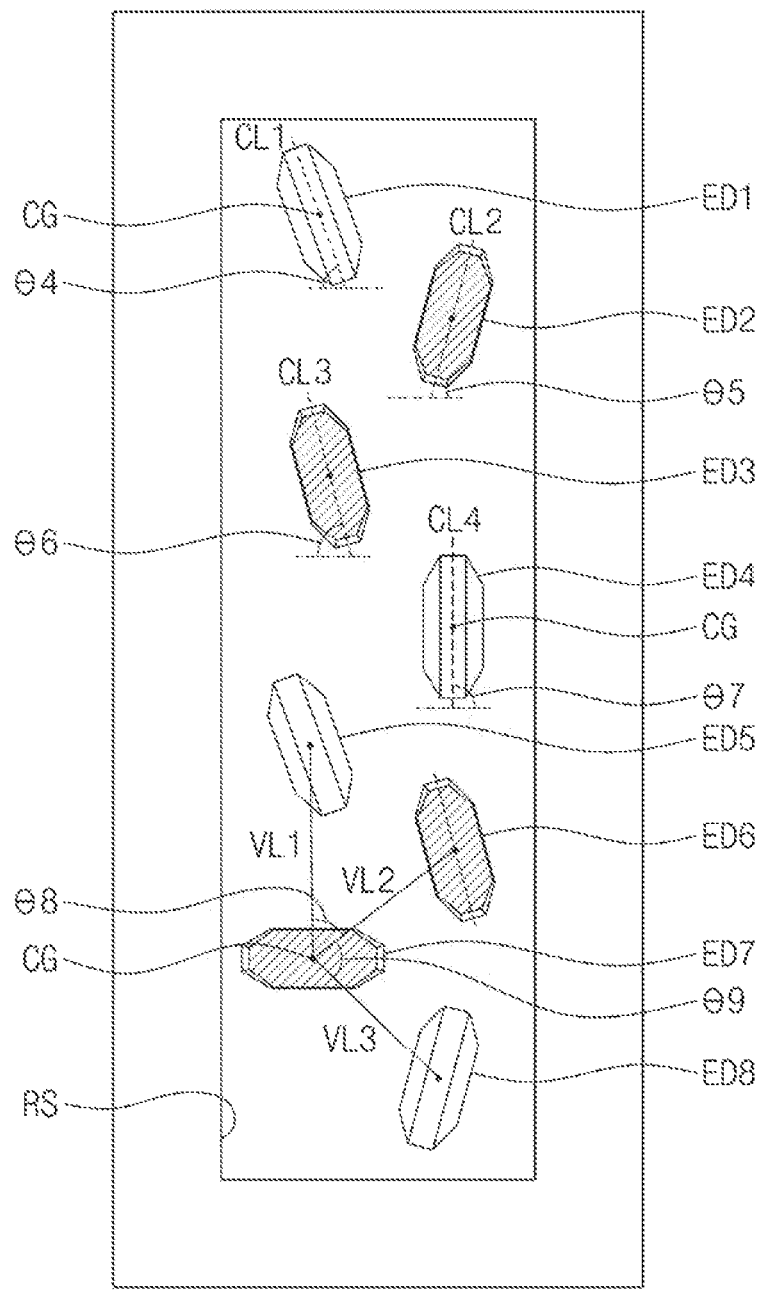
FIG. 29 is an enlarged plan view of a first pixel of FIG. 27.

FIG. 27 is a plan view illustrating a display panel of a display device according to an embodiment of the inventive concept. FIG. 28 is a sectional view taken along a line A-A' of FIG. 27. FIG. 29 is an enlarged plan view of a first pixel of FIG. 27. In the following description of the display device according to the present embodiment, an element previously described with reference to FIGS. 3, 4A, 4B, 5A, and 5B may be identified by the same reference number without repeating an overlapping description thereof.

Referring to FIGS. 27 and 28, first to third pixels PX1 to PX3 may be provided on a base layer 100. The base layer 100 may include a silicon substrate, a plastic substrate, a glass substrate, an insulating film, or a stack including a plurality of insulating layers.

The first to third pixels PX1 to PX3 may be two-dimensionally arranged. As an example, the first to third pixels PX1 to PX3 may be arranged in a second direction D2. Although not shown, additional pixels may be further provided on the base layer 100 to form two-dimensional pixel arrangement.

Each of the first to third pixels PX1 to PX3 may include a first thin-film transistor TR1, a second thin-film transistor TR2, and a plurality of light emitting devices ED. Hereinafter, one (e.g., the first pixel PX1) of the first to third pixels PX1 to PX3 will be exemplarily described.

The first and second thin-film transistors TR1 and TR2 may be disposed on the base layer 100. The first and second thin-film transistors TR1 and TR2 may be configured to have substantially the same features as those described with reference to FIGS. 3 and 4A.

A partition wall structure PAR may be provided on a fourth insulating layer 140. The partition wall structure PAR may have a bottom surface that is coplanar with a bottom surface of a first electrode E1. The partition wall structure PAR may define a recess region RS exposing the top surface of the first electrode E1. For example, the recess region RS may be defined by an inner sidewall of the partition wall structure PAR and the top surface of the first electrode E1. The recess region RS may be provided to have a specific depth DEP, when measured from a top surface of the partition wall structure PAR.

The plurality of light emitting devices ED may be provided on the first electrode E1 in the recess region RS. Each of the light emitting devices ED may be configured to have substantially the same features as that described with reference to FIGS. 3, 4A, 4B, 5A, and 5B.

The light emitting devices ED may include active light emitting devices EDa and dummy light emitting devices EDd. Each of the active light emitting devices EDa may be disposed in such a way that a first surface SU1 thereof faces the first electrode E1 or the base layer 100. A connection pattern CP may be interposed between the active light emitting device EDa and the first electrode E1. The first surface SU1 of the active light emitting device EDa may be electrically connected to the first electrode E1 through the connection pattern CP. Each of the dummy light emitting devices EDd may be disposed in such a way that a second surface SU2 thereof faces the first electrode E1 or the base layer 100. The second surface SU2 of the dummy light emitting device EDd may be spaced apart from the first electrode E1 by the metal oxide pattern MOP.

A ratio of the number of the active light emitting devices EDa to the total number of the light emitting devices ED may range from about 40% to about 60%. A ratio of the number of the dummy light emitting devices EDd to the total number of the light emitting devices ED may range from about 60% to about 40%. The number of the active light emitting devices EDa may be substantially equal to the number of the dummy light emitting devices EDd, but in an embodiment, they may be different from each other.

In an embodiment, a ratio of the number of the active light emitting devices EDa to the total number of the light emitting devices ED may range from about 60% to about 100%. In other words, the number of the active light emitting devices EDa may be greater than the number of the dummy light emitting devices EDd.

A fifth insulating layer 150 may be provided on the fourth insulating layer 140 to fill a region between the light emitting devices ED. A second electrode E2 may be provided on the fifth insulating layer 150 and the light emitting devices ED. The metal oxide pattern MOP covering the second surface SU2 of the active light emitting device EDa may have a contact hole CTH exposing a center region of the second surface SU2. The second electrode E2 may be in contact with the second surface SU2 of the active light emitting device EDa.

According to an embodiment of the inventive concept, the first electrode E1 may be a p-type electrode, and the second electrode E2 may be an n-type electrode. In the active light emitting device EDa, the p-type or first electrode E1 may be electrically connected to a p-type semiconductor layer adjacent to the first surface SU1 through the connection pattern CP, and the n-type or second electrode E2 may be electrically connected to an n-type semiconductor layer adjacent to the second surface SU2. Thus, the active light emitting device EDa may be used to emit light during an operation of the display device.

By contrast, for the dummy light emitting device EDd, the metal oxide pattern MOP may prevent the first electrode E1 from being in contact with the second surface SU2, while the n-type or second electrode E2 is connected to a p-type semiconductor layer adjacent to the first surface SU1. Thus, the dummy light emitting device EDd may not emit any light, during the operation of the display device. Since the active light emitting devices EDa accounts for about 40% to 60% of the light emitting devices ED, each of the pixels PX1 to PX3 may be used as a normal pixel.

A sixth insulating layer 160 may be provided on the second electrode E2. The sixth insulating layer 160 may have a flat top surface. A light-blocking pattern BM and a color filter CF may be provided on the sixth insulating layer 160. The light-blocking pattern BM may have an opening, which is vertically overlapped with the recess region RS, and the color filter CF may be provided in the opening. A cover layer CV may be provided on the light-blocking pattern BM and the color filter CF.

The light emitting devices ED, which are randomly arranged in the recess region RS of the first pixel PX1, will be described in more detail with reference to FIG. 29. The light emitting devices ED of the first pixel PX1 may include first to eighth light emitting devices ED1 to ED8. Each of the first to eighth light emitting devices ED1 to ED8 may have a center CG. As an example, the center CG of the light emitting device ED may be a center of gravity of the light emitting device ED.

A first center line CL1 may be defined to pass through the center CG of the first light emitting device ED1. When viewed in a plan view, the first center line CL1 may be parallel to a longitudinal axis of the first light emitting device ED1. Second to fourth center lines CL2 to CL4 of the second to fourth light emitting devices ED2 to ED4 may be defined in the same manner as the first center line CL1 of the first light emitting device ED1.

The first to fourth center lines CL1 to CL4 may not be parallel to each other. In other words, since the light emitting devices ED are randomly arranged, the first to fourth center lines CL1 to CL4 may not be parallel to each other. The first to fourth center lines CL1 to CL4 may cross each other. As an example, the first center line CL1 may be inclined at a fourth angle θ4 to the second direction D2, the second center line CL2 may be inclined at a fifth angle θ5 to the second direction D2, the third center line CL3 may be inclined at a sixth angle θ6 to the second direction D2, and the fourth center line CL4 may be inclined at a seventh angle θ7 to the second direction D2. The fourth to seventh angles θ4 to θ7 may be different from each other.

The fifth light emitting device ED5, the sixth light emitting device ED6, and the eighth light emitting device ED8 may be provided adjacent to the seventh light emitting device ED7. A first virtual line VL1 may be defined as a line connecting the center CG of the seventh light emitting device ED7 to the center CG of the fifth light emitting device ED5, a second virtual line VL2 may be defined as a line connecting the center CG of the seventh light emitting device ED7 to the center CG of the sixth light emitting device ED6, and a third virtual line VL3 may be defined as a line connecting the center CG of the seventh light emitting device ED7 to the center CG of the eighth light emitting device ED8.

The first virtual line VL1, the second virtual line VL2, and the third virtual line VL3 may have different lengths from each other. In other words, distances from the fifth light emitting device ED5, the sixth light emitting device ED6, and the eighth light emitting device ED8 to the seventh light emitting device ED7 may be different from each other.

An angle between the first virtual line VL1 and the second virtual line VL2 may be an eighth angle θ8, and an angle between the second virtual line VL2 and the third virtual line VL3 may be a ninth angle θ9. The eighth angle θ8 and the ninth angle θ9 may be different from each other.

The method of manufacturing a display device according to the present embodiment may include randomly scattering micro-LED flakes on the pixels of the display device.

The micro-LED flakes may be prepared by separating the light emitting devices ED on the patterned substrate PSS, which is manufactured by FIGS. 22, 23A, and 23B, using the mechanical lift-off method and then collecting the separated light emitting devices ED. In other words, each flake in the micro-LED flakes may be the light emitting device ED according to an embodiment of the inventive concept.

Since the micro-LED flakes are randomly scattered on the pixel, the light emitting devices ED on the first electrode E1 may be two-dimensionally and randomly arranged. In an embodiment, each of the light emitting devices ED on the first electrode E1 may be the active light emitting device EDa at a probability of 50% or may be the dummy light emitting device EDd at a probability of 50%.

According to the present embodiment, the display device may be realized by randomly arranging the light emitting devices on the pixel. Since the light emitting devices on the pixel has a large ratio of its largest width to its height, about 50% of the light emitting devices may be used as active light emitting devices. Since the light emitting devices are arranged on the pixel in the randomized manner, not in a regular manner, it may be possible to quickly and economically fabricate a large-area display panel.

According to an embodiment of the inventive concept, a patterned sapphire substrate may be provided to realize a selective area growth of a light emitting device by using a polycrystalline alumina region and a single-crystalline alumina region. Since the patterned sapphire substrate is formed of only a single material (e.g., alumina), it may be possible to prevent an impurity contamination problem, which occurs when a heterogeneous material is used, and thereby to realize a light emitting device of high purity. In addition, the selective area growth may prevent a process defect of the light emitting device. As a result, the light emitting device may be fabricated to have high reliability and excellent light extraction efficiency.

While example embodiments of the inventive concept have been particularly shown and described, it will be understood by one of ordinary skill in the art that variations in form and detail may be made therein without departing from the spirit and scope of the attached claims.

What is claimed is:

1. A method of manufacturing a light emitting device, comprising:
    preparing a patterned substrate, which includes a substrate, a polycrystalline layer on the substrate, and a seed pattern protruding above the polycrystalline layer; and
    performing a metal organic chemical vapor deposition process on the patterned substrate to form a light emitting device and an epitaxial layer on the seed pattern and the polycrystalline layer, respectively,
    wherein a growth rate of the light emitting device on the seed pattern is higher than a growth rate of the epitaxial layer on the polycrystalline layer, during the metal organic chemical vapor deposition process.

2. The method of claim 1, wherein the seed pattern comprises single-crystalline alumina, and
    the polycrystalline layer comprises polycrystalline alumina.

3. The method of claim 1, wherein the forming of the patterned substrate comprises:
    forming the seed pattern protruding from the substrate;
    forming an amorphous layer to cover the substrate and the seed pattern;
    removing a portion of the amorphous layer to expose the seed pattern, a remaining portion of the amorphous layer covering a top surface of the substrate; and
    performing a thermal treatment process on the amorphous layer to crystalize the amorphous layer to the polycrystalline layer,
    wherein the amorphous layer is formed to have a thickness of 150 nm to 1000 nm.

4. The method of claim 3, wherein the thermal treatment process is performed at a temperature of 750° ° C. to 900° C.

5. The method of claim 1, wherein the light emitting device is vertically spaced apart from the epitaxial layer.

6. The method of claim 1, wherein the forming of the light emitting device comprises:
    forming a third semiconductor layer on the seed pattern;
    forming a second semiconductor layer on the third semiconductor layer;
    forming an active layer on the second semiconductor layer; and
    forming a first semiconductor layer on the active layer.

7. The method of claim 1, further comprises:
    forming a connection pattern on a top surface of the light emitting device;
    forming a reflection pattern on a sidewall of the light emitting device; and
    separating the light emitting device from the patterned substrate by a mechanical lift-off method.

* * * * *